US006801666B1

(12) United States Patent
Henry et al.

(10) Patent No.: US 6,801,666 B1
(45) Date of Patent: Oct. 5, 2004

(54) DEVICE AND METHOD FOR TRANSFORMING A DIGITAL SIGNAL

(75) Inventors: Félix Henry, Rennes (FR); Eric Majani, Rennes (FR); Bertrand Berthelot, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/512,034

(22) Filed: Feb. 24, 2000

(30) Foreign Application Priority Data

| Feb. 24, 1999 | (FR) | ............................................ 99 02304 |
| Feb. 24, 1999 | (FR) | ............................................ 99 02305 |
| Feb. 24, 1999 | (FR) | ............................................ 99 02303 |

(51) Int. Cl.⁷ ................................................ G06K 9/36

(52) U.S. Cl. ............................. 382/240; 702/75; 703/2; 703/5; 704/204; 704/229

(58) Field of Search ............................ 382/240; 703/2; 704/229, 204; 702/75

(56) References Cited

U.S. PATENT DOCUMENTS

| 5,230,038 A | * | 7/1993 | Fielder et al. | .................. 395/2 |
| 5,610,944 A | | 3/1997 | Mau et al. | .................. 375/260 |
| 5,844,610 A | | 12/1998 | Perdrieau et al. | ............ 375/737 |
| 6,253,165 B1 | * | 6/2001 | Malvar | ........................... 703/2 |

FOREIGN PATENT DOCUMENTS

| FR | 2 667 745 | 4/1992 | ............. H04N/7/13 |
| WO | WO 00/05680 | 2/2000 | ............. G06K/9/36 |

OTHER PUBLICATIONS

Sweldens, W., "The Lifting Scheme: A Custom–Design Construction of Biorthogonal Wavelets", Applied and Computational Harmonic Analysis, US, Academic Press, vol. 3, No. 2, Apr. 1, 1996, pp. 186–200.

De Queiroz, R., et al., "Wavelet Transforms in a JPEG–Like Image Coder", IEEE Transactions on Circuits and Systems for Video Technology, US, IEEE Inc., New York, vol. 7., No. 2, pp. 419–424.

Guillemot, C., et al., "Time–Invariant and Time–Varying Multirate Filter Banks: Application to Image Coding", Annals of Telecommunications, CH, PRE SSES Polytechniques et Universitaires Romandes, Lausanne, 1998, vol. 53, pp. 192–218.

Sava, H. et al., "Parallel Pipeline Implementation of Wavelet Transforms" IEE Proceedings: Vision, Image and Signal Processing, GB, Institution of Electrical Engineers, 1997, vol. 144, pp. 355–359.

* cited by examiner

*Primary Examiner*—Anh Hong Do
(74) *Attorney, Agent, or Firm*—Fitzpatrick, Cella, Harper & Scinto

(57) ABSTRACT

A trellis filtering of a digital signal is disclosed. A method is provided of analysis filtering of an original digital signal including original samples representing physical quantities. Original samples of the digital signal are transformed by successive calculation steps into high and low frequency output samples. Any sample calculated at a given step is calculated by a predetermined function of original samples, and/or previously calculated samples, the samples being ordered in increasing rank. The signal is processed by successive series of samples, the calculations made on any series not taking into account the samples in a following series, and in that the any series terminates in a low-frequency sample.

45 Claims, 17 Drawing Sheets

DEVICE AND METHOD FOR TRANSFORMING A DIGITAL SIGNAL

BACKGROUND OF THE INVENTION

1. Field of the Invention

The present invention concerns digital signal filtering, such as the transformation of a digital signal into frequency sub-band signals.

2. Description of Related Art

Many digital filtering methods and devices are known. Analysis filterings and corresponding digital signal synthesis filterings are considered here by way of example.

These filterings are generally subsystems integrated into coding and/or decoding systems. They often require a large amount of random access memory or buffer memory space, for storing the data in the course of processing.

However, in practice, the size of the memory means is often less than the size which would be necessary for storing an entire set of data, for example of a digital image.

SUMMARY OF THE INVENTION

The present invention firstly provides a method and a device for transforming a digital signal which optimise the buffer memory occupation of the data in the course of processing.

Since the size of the memory means is often less than the size which would be necessary for storing an entire set of data, it is therefore necessary to "cut" the signal into blocks and to process the blocks one after the other.

However, between an analysis and the corresponding synthesis of a signal, other processings, such as quantization or entropic coding, are generally applied to said signal. These processings, combined with processing by blocks, cause degradation in the reconstructed signal.

The present invention also provides a method and a device for transforming a digital signal which processes the signal by blocks, whilst limiting the degradation in the reconstructed signal, where other processings are applied to the signal between its transformation and its reconstruction.

The considered filterings are implemented by trellis filters. For practical reasons, it is often necessary to modify the theoretical calculations during implementation.

For example, these filterings often require a large amount of random access memory or buffer memory space, for storing the data in the course of processing. The data are then processed by blocks, as previously exposed.

However, it is known that processing by blocks causes degradation in the reconstructed signal.

The present invention also provides a method and device for transforming a digital signal which limits the degradation in the reconstructed signal.

The invention proposes a method of analysis filtering of an original digital signal including original samples representing physical quantities, original samples of the digital signal being transformed by successive calculation steps into high and low frequency output samples, any sample calculated at a given step being calculated by a predetermined function of original samples, and/or previously calculated samples, the samples being ordered in increasing rank, characterised in that:

the signal is processed by successive series of samples, the calculations made on any series not taking into account the samples in a following series, and in that said any series terminates in a low-frequency sample.

The invention also proposes an analysis filtering method of an original digital signal including original samples representing physical quantities, comprising the following steps:

dividing the original signal in order to form plural series of samples, filtering the original samples in a predetermined order and series by series, in order to generate at least one series of high and low-frequency samples, wherein the end of said at least one series of high and low-frequency samples is a low-frequency sample.

According to the invention, the buffer memory space required for the filtering is reduced, because it is not necessary to store simultaneously all the samples in the buffer memory when being filtered series by series.

According to an other effect, as shown in FIG. 22a, where the end of a series is a high-frequency sample, it is impossible to utilise sample B when sample A is synthesized because sample B in next series has not been generated yet. As a result, a discontinuity between samples A and B is generated.

FIG. 22b where the end of a series is a low-frequency sample, when samples C and D are synthesized respectively, it is possible to use low-frequency sample in previous rank which is necessary for generating a new accurate low-frequency sample. Namely, the distortion is mainly controlled by low-frequency samples. Therefore, it is possible to refer low-frequency sample over the boundary to reduce the distortion. As a result, a discontinuity between samples C and D is not generated, so sample C will be used for the synthesis of D and E samples. This configuration considerably limits the degradations on bordering samples.

The invention also proposes a method of synthesis filtering of a digital signal including high and low-frequency interlaced samples obtained by applying the above analysis filtering method to original samples, wherein:

the signal is processed by successive series of samples in a predetermined order, and the end of the series is a low-frequency sample.

By such analysis method, the distortions on the synthesized signals, especially on borders of series, are cancelled. The synthesis then needs only small buffer memory and provides signal without any distortion.

The invention also proposes a method of synthesis filtering of a digital signal including high and low-frequency interlaced samples obtained by applying the above analysis filtering method to an original digital signal including samples representing physical qualities, samples being ordered by increasing rank, characterised in that:

the signal is processed by successive series of samples, the calculations made on any series not taking into account the samples of a following series, and in that said any series terminates in a low-frequency sample.

In addition, the buffer memory space taken up by the data currently being processed is optimised, since the signal is processed by blocks. Thus complex filterings can be integrated into numerous appliances, without these requiring very large memories.

According to a preferred characteristic, on synthesis, each series of samples terminates after a last sample of a series determined at the time of an analysis filtering as defined above.

According to another preferred characteristic, both on analysis and on synthesis, said any series terminates in a low-frequency sample of the lowest resolution level. This configuration considerably limits the degradation in the reconstructed signal.

The invention also proposes a method of analysis filtering of an original digital signal including original samples representing physical quantities, original samples of the digital signal being transformed by successive calculation steps into high and low frequency output samples, any sample calculated at a given step being calculated by a predetermined function of original samples, and/or previously calculated samples, the samples being ordered in increasing rank, characterised in that:

the signal is processed by first successive input blocks of samples, the calculations made on a first input block under consideration taking into account only the original or calculated samples belonging to the first input block under consideration, the first input block under consideration and the first following input block overlap over a predetermined number of original samples.

According to preferred characteristics:

the start limit of the first input block under consideration is formed between a first original sample and a first output sample, passing successively from a previous sample to a following sample calculated according to the previous sample, the following sample having a rank equal to or greater than the previous sample, the end limit of the first input block under consideration is formed between a second original sample and a second output sample, passing successfully from a previous sample to a following sample calculated according to the previous sample, the following sample having a rank equal to or lower than the previous sample, the end limit of the first input block under consideration and the start limit of the first following input block are such that there is no compatibility sample having a rank strictly lower than the rank of the sample belonging to the start limit of this first following input block and to the same row as the compatibility sample, and at the same time a rank strictly greater than the rank of the sample belonging to the end limit of the first input block under consideration and to the same row as the compatibility sample.

By virtue of the invention, the buffer memory occupation of the data in the course of processing is optimised. Thus complex filterings can be integrated in many appliances, without requiring very large memories.

In addition, the inventors have found that the invention limits the degradations in the reconstructed signal. This is because chopping the signal to be processed in order to filter it, and then applying other processings to it, such as quantization or entropic coding, causes discontinuities in the signal which is subsequently reconstructed. These discontinuities are eliminated by virtue of the invention.

According to another characteristic, the method of analysis filtering, respectively the method of synthesis by successive input blocks of samples, is particularly efficient for two dimensional digital original signals in term of memory required and also avoids distortions generated by such signal division.

According to a preferred characteristic, first adjacent output blocks are formed, each first output block corresponding respectively to a first input block, the boundary between two first output blocks being situated between a third and a fourth output sample, the third output sample having a rank lower than that of the fourth output sample, the third and fourth samples being consecutive and chosen so that:

all the samples which have a rank less than or equal to the third output sample are original or calculated samples which are situated in one of the first input blocks, all the samples which have a rank greater than or equal to the fourth output sample are original or calculated samples which are situated in another one of the first input blocks.

According to another preferred characteristic, two first successive input blocks overlap over a single original sample. Thus the memory occupation of the data currently being processed is minimal, since the overlap between blocks is minimal. Preferably, this original sample has the same rank as a low-frequency output sample. Thus the distortions in the reconstructed signal are minimal. The increase in coding efficiency from an overlap of 0 to an overlap over a single sample is very significant and noticeable, while it is much less for further increases in overlap size. Most of distortions of the reconstructed image are reduced in a particularly effective manner with the invention while a larger overlap does not provide effective improvement for distortions. In contradiction with the knowledge of a person skilled in the art, such distortion reduction is not linearly dependant of the amount of overlap samples.

The invention also concerns a method of synthesis filtering of a digital signal including high and low frequency interlaced samples obtained by applying the analysis filtering method according to the invention to an original digital signal including samples representing physical quantities, the samples being ordered in increasing rank, characterised in that:

the signal is processed by second successive input blocks of samples, the calculations performed on a second given input block taking into account only the samples belonging to the given input block, the second input blocks are formed so that the calculations are adapted to the limits of the second input blocks in correspondence with the calculations made on analysis.

According to a preferred characteristic, the synthesis filtering method is such that second adjacent output blocks are formed, any second output block includes samples having the same ranks as the samples of a first output block used during the analysis filtering.

The invention also proposes a method of analysis filtering of an original digital signal including original samples representing physical quantities, original samples of the digital signal being transformed by successive calculation steps into high and low frequency output samples, the samples being ordered by increasing rank, any sample under consideration calculated at a given step being calculated by a predetermined function which makes it depend on several original samples, and/or previously calculated samples, one of them having the same rank as the sample under consideration, characterised in that the calculation of at least one sample under consideration is modified in order to:

eliminate its dependence on at least one original sample and/or previously calculated sample having a different rank from the sample under consideration, transfer the eliminated dependence to the original sample or previously calculated sample, having the same rank as the sample under consideration.

The invention applies notably to the case where the signal is processed by successive input blocks of samples, the calculation effected on a given block taking into account only the original or calculated samples belonging to the given input block.

By virtue of the invention, the degradation in the reconstructed signal is limited. This is because the normalization properties of the transformations effected are preserved with the invention.

In addition, the buffer memory occupation by the data in the course of processing is optimised, since the signal is processed by blocks. Thus complex filterings can be integrated in many apparatuses, without their requiring very large memories.

According to a preferred characteristic, the predetermined function is a predetermined linear combination of several original samples, and/or previously calculated samples, weighted by respective weighting coefficients, previously calculated low-frequency samples on which there depend the sample from which the eliminated dependence issued and the sample to which the eliminated dependence is transferred are considered, a total weight of the sample from which the eliminated dependence issued is calculated by setting to the value one the low-frequency samples previously calculated and calculating the value of this sample, a total weight of the sample to which the eliminated dependence is transferred is calculated by setting to the value one the low-frequency samples previously calculated and calculating the value of this sample, the weighting coefficient of the original sample or previously calculated sample, having the same rank as the sample under consideration, is modified by adding the product of the total weight of the sample from which the eliminated dependence issued and the weighting coefficient of this eliminated dependence, this product also being divided by the total weight of the sample to which the eliminated dependence is transferred.

This implementation entails calculations which are simple.

The invention also concerns a digital signal coding method which includes the analysis filtering as defined above, a quantization of the previously filtered samples, and an entropic coding of the previously quantized samples.

According to this coding method, the signal is processed by successive series of samples, the calculations made on any series not taking into account the samples of a following series, and said any series terminates in a low-frequency sample.

The invention also concerns a method of decoding a digital signal coded according to the above coding method, including:

an entropic decoding of coded samples of the coded digital signal, a dequantization of the previously decoded samples, a synthesis filtering of the previously dequantized samples, as defined above.

According to the decoding method, the signal is processed by successive series of samples, the calculations made on any series not taking into account the samples of a following series, and said any series terminates in a low-frequency sample.

By virtue of the invention, the degradations in the reconstructed signal are limited.

According to preferred characteristics, the digital signal is an image signal and the original samples are rows or columns of the image. The invention-applies advantageously to an image signal, which generally requires a large amount of memory space. This memory space is reduced by virtue of the invention.

Correlatively, the invention proposes analysis filtering, synthesis filtering, coding and decoding devices integrating respectively the analysis and synthesis filtering, which have means of implementing the previously disclosed characteristics.

The invention also concerns a digital apparatus including the above device or means of implementing the above method. The advantages of the device and of the digital apparatus are identical to those previously disclosed.

The invention also concerns an information storage means, which can be read by a computer or by a microprocessor, integrated or not into the device, possibly removable, and stores a program implementing the filtering method.

The invention also concerns an analysis filtering method of an original digital signal including original samples representing physical quantities, comprising the following steps:

dividing the original signal in order to form plural blocks of samples, filtering the original samples in a predetermined order and block by block, in order to generate blocks of high and low-frequency samples, wherein adjacent blocks overlap over a single original sample.

By such method, the buffer memory space required for the filtering is reduced because it is not necessary to store simultaneously all the samples in the buffer memory when filtering the signal block by block and overlap size is minimum. Also, even if overlap size is minimum, a discontinuity between samples over a boundary between blocks is sufficiently suppressed. This is because there is a great difference in the reconstructed signal between overlaps size 0 and 1 but there is not a great difference in the reconstructed signal between overlap size 1 and full overlap in term of the discontinuity (distortion), since such distortion is not reduced in proportion to increase of the size of overlap.

BRIEF DESCRIPTION OF THE DRAWINGS

The characteristics and advantages of the present invention will emerge more clearly from a reading of a preferred embodiment illustrated by the accompanying drawings, in which.

DETAILED DESCRIPTION OF THE PREFERRED EMBODIMENTS

Figure 1:
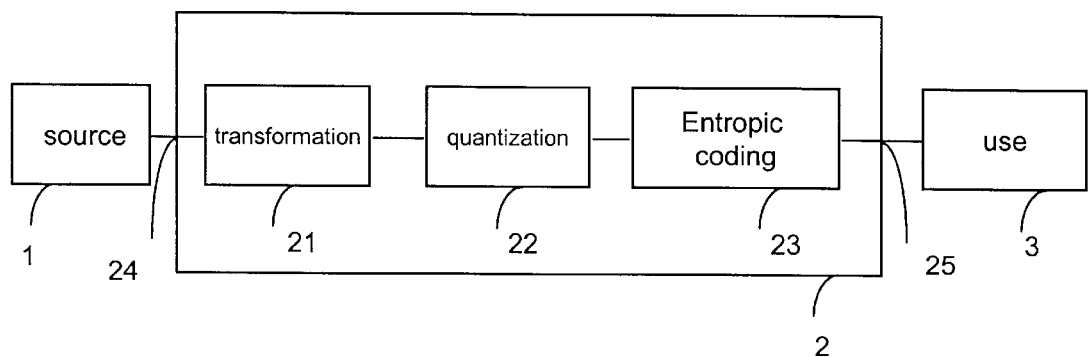
FIG. 1 depicts schematically a data processing device according to the invention.

According to a chosen embodiment depicted in FIG. 1, a data processing device according to the invention is a data coding device 2 which has an input 24 to which a source 1 of uncoded data is connected.

The source 1 has for example a memory means, such as a random access memory, a hard disk, a diskette or a compact disk, for storing uncoded data, this memory means being associated with a suitable reading means for reading the data therein. A means for recording the data in the memory means can also be provided.

It will more particularly be considered hereinafter that the data to be coded are a series of digital samples representing an image IM.

The source 1 supplies a digital image signal SI at the input of the coding circuit 2. The image signal SI is a series of digital words, for example bytes. Each byte value represents a pixel of the image IM, here with 256 grey levels, or black and white image. The image can be a multispectral image, for example a colour image having components in three frequency bands, of the red/green/blue type or luminance and chrominance type. Each band is then processed in a similar fashion to the monospectral image.

Means 3 using coded data are connected at the output 25 of the coding device 2.

The user means 3 include for example means of storing coded data, and/or means of transmitting coded data.

The coding device 2 has conventionally, as from the input 24, a transformation circuit 21, more particularly relating to the present invention, and several example embodiments of which will be detailed hereinafter. The transformations envisaged here are decompositions of the data signal into frequency sub-band signals, so as to effect an analysis of the signal.

The transformation circuit 21 is connected to a quantization circuit 22. The quantization circuit implements a quantization known per se, for example a scalar quantization or a vector quantization, of the samples, or groups of samples, of the frequency sub-band signals supplied by the circuit 21.

The circuit 22 is connected to an entropic coding circuit 23, which performs an entropic coding, for example a Huffman coding, or an arithmetic coding, of the data quantized by the circuit 22.

Figure 2:
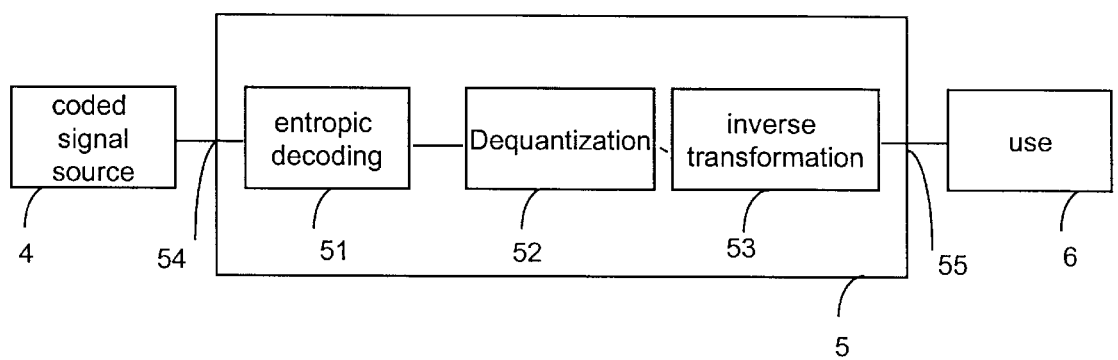
FIG. 2 depicts schematically another data processing device according to the invention.

FIG. 2 depicts another data processing device according to the invention, in the form of a device 5 for decoding data coded by the device 2.

Means 4 using coded data are connected at the input 54 of the decoding device 5. The means 4 include for example coded data memory means, and/or means of receiving coded data which are adapted to receive the coded data transmitted by the transmission means 3.

Means 6 using decoded data are connected at the output 55 of the decoding device 5. The user means 6 are for example image display means, or sound reproduction means, according to the nature of the data processed.

The decoding device 5 performs overall operations which are the inverse of those of the coding device 2. The device 5 includes an entropic decoding circuit 51, which performs an entropic decoding corresponding to the coding of the circuit 23. The circuit 51 is connected to a dequantization circuit 52, corresponding to the quantization circuit 22. The circuit 52 is connected to an inverse transformation circuit 53, corresponding to the transformation circuit 21. The present invention relates more particularly to the inverse transformation circuit 53. Several example embodiments will be detailed hereinafter. The transformations envisaged here effect a synthesis of the digital signal, from frequency sub-band signals.

The coding device and/or the decoding device can be integrated into a digital apparatus, such as a computer, a printer, a facsimile machine, a scanner or a digital photographic apparatus, for example.

The coding device and the decoding device can be integrated into the same digital apparatus, for example a digital photographic apparatus. In this case, the data processing device effects the coding and decoding of the data in a combined fashion, as disclosed hereinafter.

Figure 3:
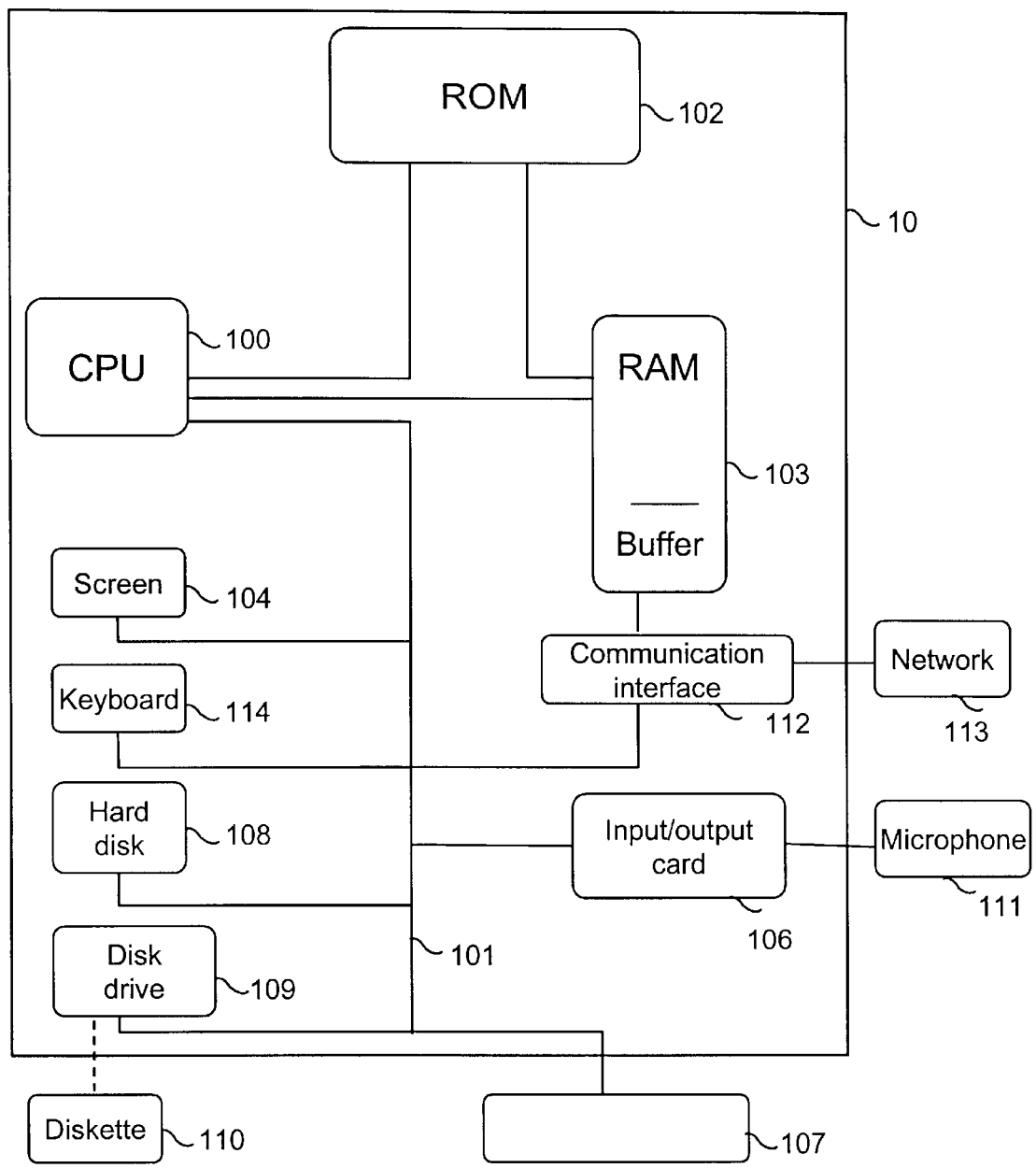
FIG. 3 depicts an embodiment of the data processing device according to the invention.

With reference to FIG. 3, an example of a device 10 implementing the invention is described. This device is adapted to transform a digital signal, and, according to the examples developed hereinafter, to analyse it or to synthesis it.

The device 10 is here a microcomputer having a communication bus 101 to which there are connected:
 a central unit 100,
 a read only memory 102,
 a random access memory 103,
 a screen 104,
 a keyboard 114,
 a hard disk 108,
 a disk drive 109 adapted to receive a diskette 110,
 an interface 112 for communication with a communication network 113,
 an input/output card 106 connected to a microphone 111.

The hard disk 108 stores the programs implementing the invention, which will be described below, as well as the data to be coded and the data coded according to the invention. These programs can also be read on the diskette 110, or received via the communication network 113, or stored in the read only memory 102.

In more general terms, the programs according to the present invention are stored in a storage means. This storage means can be read by a computer or by a microprocessor. This storage means is integrated or not into the device, and can be removable. For example, it can have a magnetic tape, a diskette or a CD-ROM (fixed-memory compact disc).

When the device is powered up, the programs according to the invention are transferred into the random access memory 103, which then contains the executable code of the invention and registers containing the variables necessary for implementing the invention. The random access memory includes a buffer memory.

The device 10 can receive data to be coded from a peripheral device 107, such as a digital photographic apparatus, or a scanner, or any other means of acquiring or storing data.

The device 10 can also receive data to be coded from a distant device, via the communication network 113, and transmit coded data to a distant device, still via the communication network 113.

The device 10 can also receive data to be coded from the microphone 111. These data are then a sound signal.

The screen 104 enables a user notably to display the data to be coded, and serves, with the keyboard 114, as a user interface.

Figure 4:
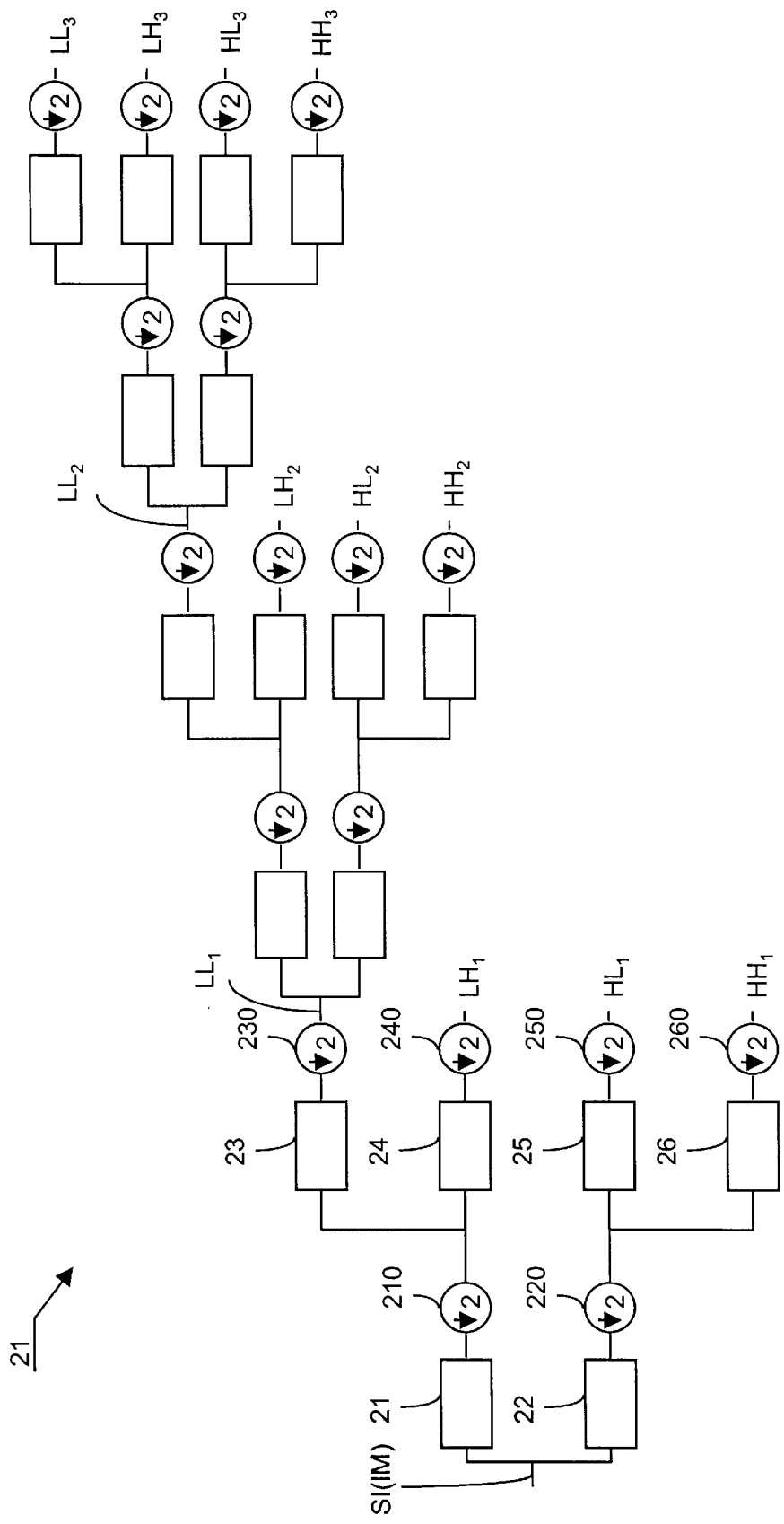
FIG. 4 depicts an embodiment of a transformation circuit included in the data processing device of FIG. 1.

With reference to FIG. 4, the transformation circuit 21, or analysis circuit, is a dyadic decomposition circuit with two levels. The circuit 21 is, in this embodiment, a conventional set of filters, respectively associated with decimators by two, which filter the image signal in two directions, into sub-band signals with high and low spatial frequencies. The relationship between a high-pass filter and a low-pass filter is determined by the conditions for perfect reconstruction of the signal. Different examples of filters will be envisaged hereinafter. It should be noted that the vertical and horizontal decomposition filters are not necessary identical, although in practice this is generally the case. The circuit 21 has here two successive analysis units for decomposing the image IM into sub-band signals according to two resolution levels.

In general terms, the resolution of a signal is the number of samples per unit length used for representing this signal. In the case of an image signal, the resolution of a sub-band signal is related to the number of samples per unit length used for representing this sub-band signal horizontally and vertically. The resolution depends on the number of decimations effected, on the decimation factor and on the resolution of the initial image.

The first analysis unit receives the digital image signal SI and applies it to two digital filters, respectively low pass and high pass, 210 and 220, which filter the image signal in a first direction, for example horizontal in the case of an image signal. After passing through decimators by two D210 and D220, the resulting filtered signals are respectively applied to two low pass filters 230 and 250, and high pass filters 240 and 260, which filter then in a second direction, for example vertical in the case of an image signal. Each resulting filtered signal passes through a respective decimator by two D230, D240, D250 and D260. The first unit delivers as an output four sub-band signals $LL_1$, $LH_1$, $HL_1$ and $HH_1$ with the highest resolution $RES_1$ in the decomposition.

The sub-band signal $LL_1$ includes the components, or samples, of low frequency in both directions of the image signal. The sub-band signal $LH_1$ includes the components of low frequency in a first direction and of high frequency in a second direction, of the image signal. The sub-band signal $HL_1$ includes the components of high frequency in the first direction and the components of low frequency in the second direction. Finally, the sub-band signal $HH_1$ includes the components of high frequency in both directions.

Each sub-band signal is a set of real samples constructed from the original image, which contains information corresponding to a respectively vertical, horizontal and diagonal orientation of the image contours, in a given frequency band. Each sub-band signal can be assimilated to an image.

The sub-band signal $LL_1$ is analysed by an analysis unit similar to the previous one in order to supply four sub-band signals $LL_2$, $LH_2$, $HL_2$ and $HH_2$ of resolution level $RES_2$.

Each of the sub-band signals of resolution $RES_2$ also corresponds to an orientation in the image.

Figure 6:
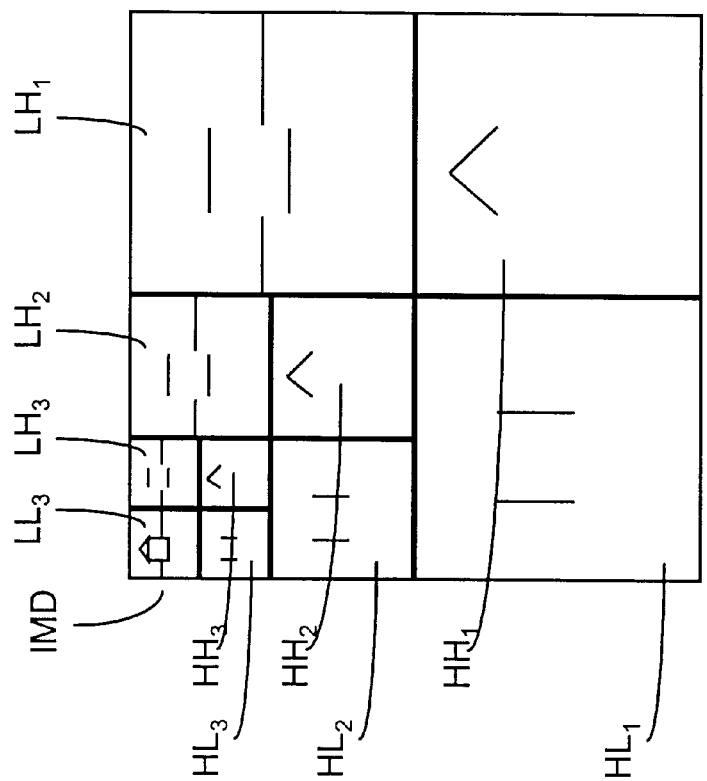
FIG. 6 is a transformed image according to the invention.
Figure 5:
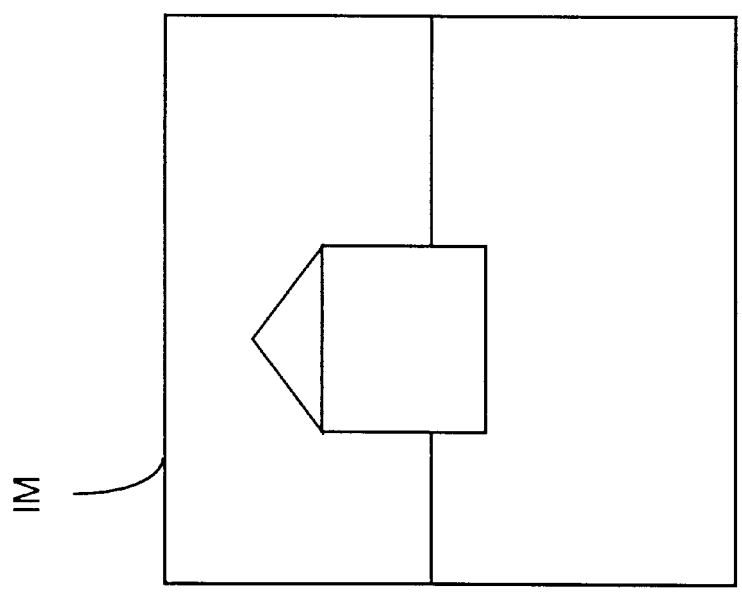
FIG. 5 is an image to be coded according to the invention.

A digital image IM at the output of the image source 1 is represented schematically in FIG. 5, whilst FIG. 6 represents the image IMD resulting from the decomposition of the image IM, into seven sub-bands according to two resolution levels, by the circuit 21. The image IMD includes as much information as the original image IM, but the information is chopped frequentially according to two resolution levels.

Naturally, the number of resolution levels, and consequently of sub-bands, can be chosen differently, for example 10 sub-bands over three resolution levels, or 13 sub-bands over four resolution levels, for a bidimensional signal such as an image. The number of sub-bands per resolution level can also be different. In addition, the decomposition can be non-dyadic. The analysis and synthesis circuits are adapted to the dimension of the processed signal.

In FIG. 6, the samples issuing from the transformation are arranged sub-band by sub-band. However, the image IMD can be represented in an equivalent fashion according to a so-called interlaced mode, in which the samples of the different sub-band signals are grouped together according to their spatial origin in the image. This representation has the advantage that the samples of the transformed image can be calculated in place, that is to say a calculated sample is stored in memory in place of a sample which was used for calculating it. It should be noted that calculation in place is not essential for the present invention.

Hereinafter, interlaced representations will be dealt with. The transformation circuits which make it possible to obtain an interlaced representation are depicted in the form of a trellis.

Figure 7:
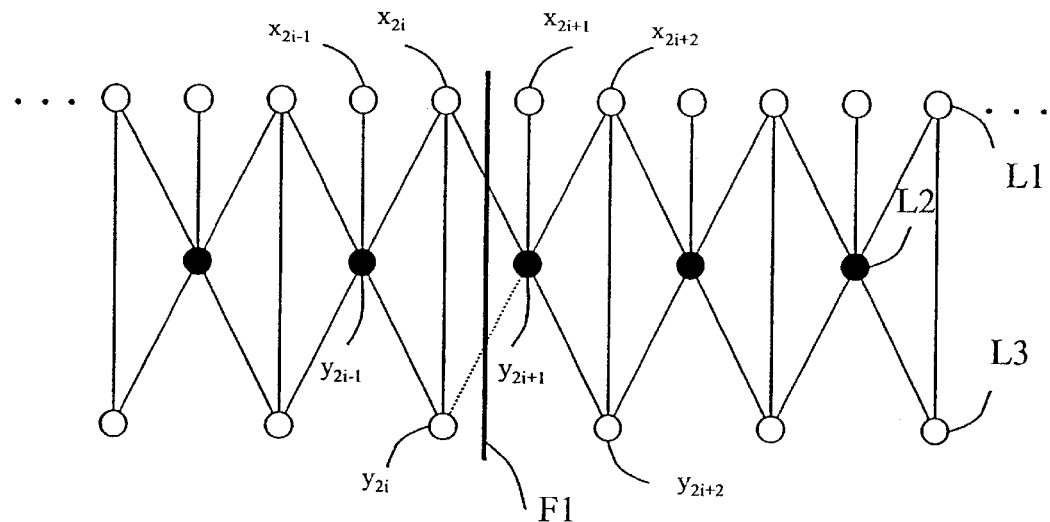
FIG. 7 is a trellis representing the functioning of a transformation circuit according to the invention.

FIG. 7 is a trellis representing the functioning of a transformation circuit which performs an analysis of a digital signal according to one resolution level, in one dimension.

A portion of the signal to be transformed, here eleven samples, has been depicted. It should be noted that each signal sample to be transformed can be a sample or can be a series of samples. According to one example, each sample is a row of a digital image. The filtering effected by trellis is then a vertical filtering of the image. As a variant, in an equivalent fashion, the samples are the columns of the image and the filtering is a horizontal filtering of the image.

The transformation circuit includes two associated filters $H_0$ and $H_1$, respectively low pass and high pass. The filters chosen are 5/3 filters, which can be represented by their samples:

$H_0 = [-1\ 2\ 6\ 2\ -1]/8$ $H_1 = [-1\ 2\ -1]/2$

According to the so-called "lifting" method of Sweldens, the low-frequency filter $H_0$ can be expressed as a function of the high-frequency filter $H_1$, according to an equation of the type:

$H_0 = [0\ 0\ 1\ 0\ 0] + \alpha.[1\ 0\ 1] * H_1$ where α is a multiplying coefficient, equal to 0.25 for a 5/3 filter, and "*" represents the convolution operation. This type of decomposition is said to be reversible.

Accordingly, the low-frequency samples are calculated from the high-frequency samples and samples of the original signal.

Hereinafter:

$x_{2i-1}, x_{2i}, x_{2i+1}, \ldots$ denote the samples of the signal to be transformed, where i is an integer, $y_{2i-1}, y_{2i}, y_{2i+1}, \ldots$ denote the samples obtained by transformation.

The samples with even indices are here the low-frequency samples, and the samples with odd indices are the high-frequency samples.

The index of a sample represents its rank in the ordered series forming the signal.

The calculations performed in the transformation circuit are calculations in place, that is to say a calculated sample, of given rank, is stored in place of another sample with the same rank used for calculating it.

In addition, the samples of the signal to be transformed are processed in an ordered fashion, in increasing rank.

The first row L1 of the trellis includes the samples to be filtered $\{\ldots, x_{2i}, x_{2i+1}, \ldots\}$, where the rank of the samples varies in steps of one, of the original signal. These samples are stored in the buffer memory 103 as they become useful for the filtering.

The second row L2 of the trellis includes the high-frequency samples with the first resolution level $\{\ldots, y_{2i-1}, y_{2i+1}, \ldots\}$, where the rank of the samples varies in steps of two. The high-frequency sample is obtained by the formula:

$$y_{2i+1} = x_{2i+1} - 0.5.(x_{2i} + x_{2i+2}).$$

After it is calculated, this sample is stored in the buffer memory 103, in place of the sample with the same rank in the original signal $x_{2i+1}$.

The third row L3 of the trellis includes the low frequency samples $\{\ldots y_{2i}, y_{2i+2}, \ldots\}$, where the rank of the sample varies in steps of two. The low frequency sample $y_{2i}$ is obtained by the formula:

$$y_{2i} = x_{2i} + 0.25.(y_{2i-1} + y_{2i+1}).$$

After it is calculated, this sample is stored in the buffer memory 103, in place of the sample $x_{2i}$ with the same rank in the original signal.

The result of the transformation of the original signal $\{\ldots, x_{2i}, x_{2i+1}, \ldots\}$ by the 5/3 filters is an interlaced signal of the form: $\{\ldots, y_{2i}, y_{2i+1}, \ldots\}$, that is to say having a succession of high-frequency and low-frequency samples.

Naturally, it is possible to perform similar operations on a different number of samples, or on a different number of resolution levels, or to use other filters on one or more resolution levels.

In practice, only a predetermined maximum number of samples can be stored in memory 103. It is therefore necessary to cut the signal when this number is reached, to process the sample stored in memory 103, and then to recommence with the following series of samples. The calculations previously presented must be adapted accordingly.

The inventors found that the location of the boundary between two successive series of samples has an influence on the quality of reconstruction of the signal. More particularly, a boundary placed just after a low frequency sample limits any discontinuities which may appear when the signal is reconstructed.

In fact, the input signal is cut by the boundary F1, placed after the sample $x_{2i}$, that is to say after the low-frequency sample $y_{2i}$. The calculations previously presented are not affected as far as the sample $y_{2i-1}$.

In order to determine the sample $y_{2i}$, only samples as far as the index 2i are available, the following samples being "unknown". The calculation of the sample $y_{2i}$ is adapted so as to eliminate the branch coming from the sample $y_{2i+1}$. The sample $y_{2i}$ is thus determined as a function of the samples $y_{2i-1}$ and $x_{2i}$. In order to determine the sample $y_{2i}$, it is for example possible to apply the symmetrical reflection principle, that is to say:

$$y_{2i} = x_{2i} + 0.25.(2 \times y_{2i-1}).$$

When the following series of samples is processed, the samples are determined without the boundary F1 having any influence, that is to say no branch is eliminated because of the presence of the boundary F1, as from the sample $y_{2i+1}$.

Figure 8:
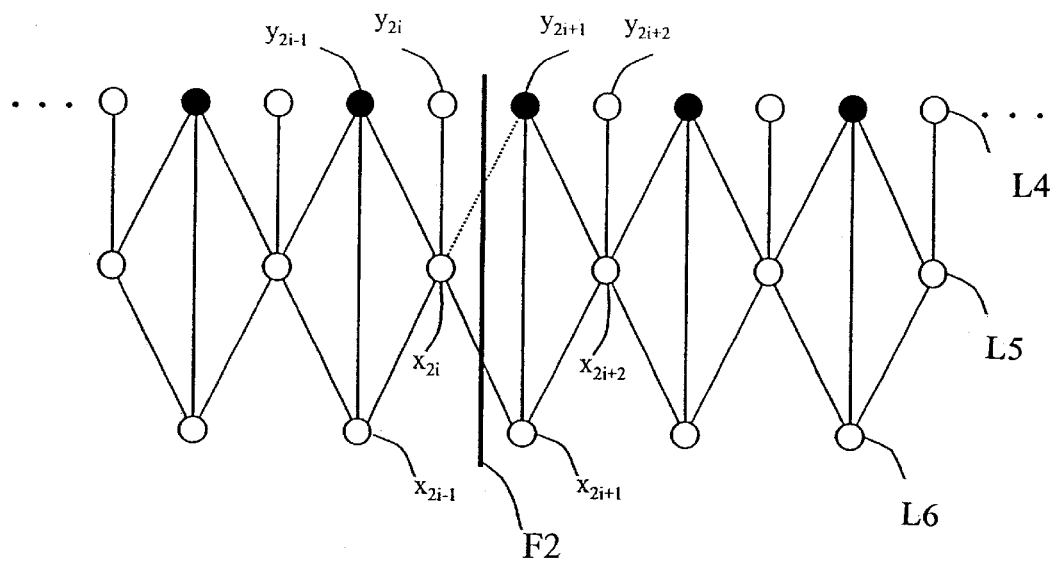
FIG. 8 is a trellis representing the functioning of the transformation circuit which is the inverse of that of FIG. 7.

FIG. 8 is a trellis representing the functioning of the inverse transformation circuit, or synthesis circuit, corresponding to the trellis of FIG. 7. The samples to be filtered are here the interlaced high and low frequency samples obtained after analysis filtering of a digital image. These samples have possibly been modified by another processing between analysis and synthesis.

The first row L4 includes the high-frequency samples $\{\ldots, y_{2i-1}, y_{2i+1}, \ldots\}$, where the rank of the samples varies in steps of two, interlaced with the low frequency samples $\{\ldots y_{2i}, y_{2i+2}, \ldots\}$ where the rank of the samples varies in steps of two.

The second row L5 includes the samples of even rank $\{\ldots, x_{2i}, x_{2i+2}, \ldots\}$, where the rank of the samples varies in steps of two, of the reconstructed signal. The sample of even rank $x_{2i}$ is obtained by the formula:

$$x_{2i} = y_{2i} - 0.25.(y_{2i-1} + y_{2i+1}).$$

After it is calculated, the sample $x_{2i+1}$ is stored in the buffer memory 103 in place of the sample $y_{2i}$.

The third row L6 includes samples of odd rank $\{\ldots, x_{2i+1}, \ldots\}$, where the rank of the samples varies in steps of two, of the reconstructed signal. The sample of odd rank $x_{2i+1}$ is obtained by the formula:

$$x_{2i+1} = y_{2i+1} + 0.5.(x_{2i+2} + x_{2i}).$$

After it is calculated, the sample $x_{2i+1}$ is stored in the buffer memory 103 in place of the sample $y_{2i+1}$.

As before, it is necessary to place a boundary F2 in order to process the signal by series of samples. The boundary F2 is placed after a low-frequency sample $y_{2i}$. In addition, the location of the boundary F2 depends on that of the boundary F1, so as to adapt the calculations in a manner corresponding to the analysis. In other words, the boundary F2 is placed here so as to eliminate a branch corresponding to the branch eliminated in the previous figure, which ensures perfect reconstruction of the signal in the absence of any processing between analysis and synthesis.

The calculation of $x_{2i}$ is thus adapted to the boundary F2, and the sample $x_{2i}$ depends only on the samples $y_{2i-1}$ and $y_{2i}$. The other samples are not affected. The following reconstructed sample $x_{2i+1}$ depends in particular on the sample $x_{2i}$, which limits the discontinuity at the boundary in the reconstructed signal.

Figure 9:
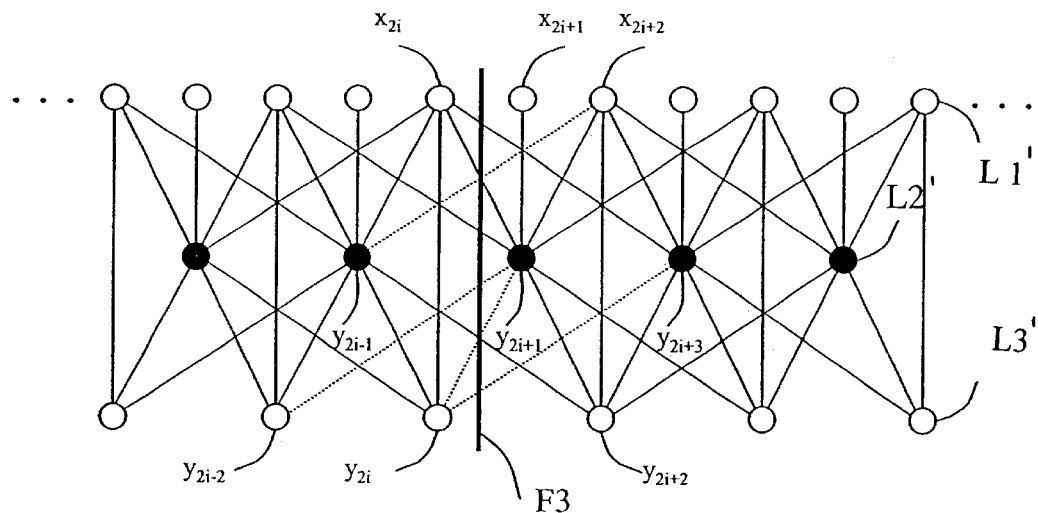
FIG. 9 is a trellis representing the functioning of a transformation circuit according to the invention.

FIG. 9 is a trellis representing the functioning of another transformation circuit which performs a digital signal analysis according to one resolution level, in one dimension. The transformation circuit includes two associated filters $H_0$ and $H_1$, respectively low pass and high pass.

The input samples are processed in an ordered fashion, in increasing rank.

The chosen filters are 13/7 filters, for example having the following filters as a low-pass filter $H_0$ and high-pass filter $H_1$.

$$H_0=[-1\ 0\ 18\ -16\ -63\ 144\ 348\ 144\ -63\ -16\ 18\ 0\ -1]/512$$

$$H_1=[1\ 0\ -9\ 16\ -9\ 0\ 1]/16$$

By performing calculations similar to those previously presented, the following relationships between the samples of the trellis are obtained.

The first row L1' of the trellis includes the samples to be filtered $\{\ldots x_{2i}, x_{2i+1}, \ldots\}$, where the rank of the samples varies in steps of one. These samples are stored in the buffer memory 103 as they become useful for filtering.

The second row L2' includes the high-frequency samples $\{\ldots, y_{2i-1}, y_{2i+1}, \ldots\}$, where the rank of the samples varies in steps of two, obtained by the formula:

$$y_{2i+1}=x_{2i+1}-(-x_{2i-2}+9.x_{2i}+9.x_{2i+2}-x_{2i+4})/16.$$

After it is calculated, the sample $y_{2i+1}$ is stored in the buffer memory, in place of the sample of the original signal with the same rank.

The third row L3' includes the low-frequency samples, $\{\ldots, y_{2i}, y_{2i+2}, \ldots\}$, where the rank of the samples varies in steps of two, obtained by the formula:

$$y_{2i}=x_{2i}+(-y_{2i-3}+9.y_{2i-1}+9.y_{2i+1}-y_{2i+3})/32.$$

After it is calculated, the sample $y_{2i}$ is stored in the buffer memory, in place of the sample of the original signal with the same rank.

A boundary F3 is placed after the low-frequency sample $y_{2i}$. The boundary F3 causes a change in the calculation of the samples $y_{2i-2}$, $y_{2i-1}$ and $y_{2i}$, which consists of eliminating the branches cut by the boundary F3, since the samples placed after the boundary are unknown when the samples placed before the boundary are calculated. Thus the sample $y_{2i-1}$ no longer depends on the sample $x_{2i+2}$, the samples $y_{2i-2}$ and $y_{2i}$ no longer depend on the sample $y_{2i+1}$ and the sample $y_{2i}$ no longer depends on the sample $y_{2i+3}$.

To the right of the boundary F3, the calculations are not modified by the presence of the boundary.

Figure 10:
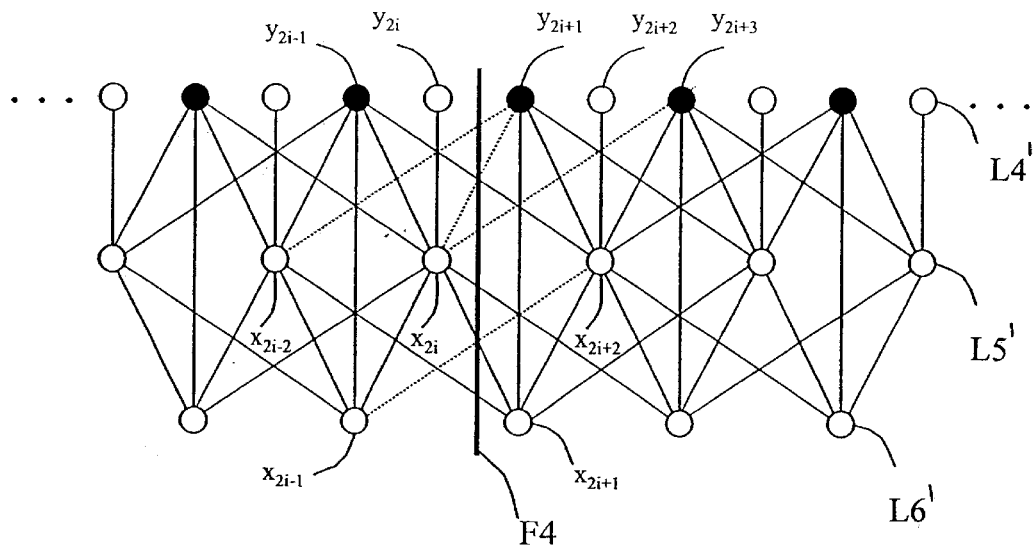
FIG. 10 is a trellis representing the functioning of the transformation circuit which is the inverse of that of FIG. 9.

FIG. 10 is a trellis representing the functioning of the inverse transformation circuit, or synthesis circuit corresponding to the trellis of FIG. 9.

The first row L4' of the trellis includes the low-frequency samples $\{\ldots, y_{2i}, y_{2i+2}, \ldots\}$, where the rank of the samples varies in steps of two, interlaced with the high-frequency samples $\{\ldots, y_{2i-1}, y_{2i+1}, \ldots\}$, where the rank of the samples varies in steps of two, obtained by analysis filtering.

The second row L5' of the trellis includes the samples $\{\ldots, x_{2i}, x_{2i+2}, \ldots\}$ of even rank of the reconstructed signal which were obtained by the formula:

$$x_{2i}=y_{2i}-(-y_{2i-3}+9.y_{2i-1}+9.y_{2i+1}-y_{2i+3})/32.$$

After it is calculated, the sample $x_{2i}$ is stored in the buffer memory, in place of the intermediate sample with the same rank.

The third row L6' of the trellis includes the samples $\{\ldots, x_{2i-1}, x_{2i+1}, \ldots\}$ of even rank of the reconstructed signal which were obtained by the formula:

$$x_{2i+1}=y_{2i+1}+(-x_{2i-2}+9.x_{2i}+9.x_{2i+2}-x_{2i+4})/16.$$

After it is calculated, the sample $x_{2i+1}$ is stored in the buffer memory, in place of the intermediate sample with the same rank.

As before, a boundary F4 is placed after a low-frequency sample $y_{2i}$. This causes a change in the calculation of the samples $x_{2i-2}$, $x_{2i-1}$ and $x_{2i}$, which consists of eliminating the branches cut by the boundary F4. Thus the sample $x_{2i-2}$ no longer depends on the sample $y_{2i+1}$, the sample $x_{2i-1}$ no longer depends on the sample $x_{2i+2}$ and the sample $x_{2i}$ no longer depends on the samples $y_{2i+1}$ and $y_{2i+3}$.

To the right of the boundary F4, the calculations are not modified by the presence of the boundary.

The reconstructed signal has no discontinuity, since the samples of the reconstructed signal are all connected to their neighbours.

Figure 11:
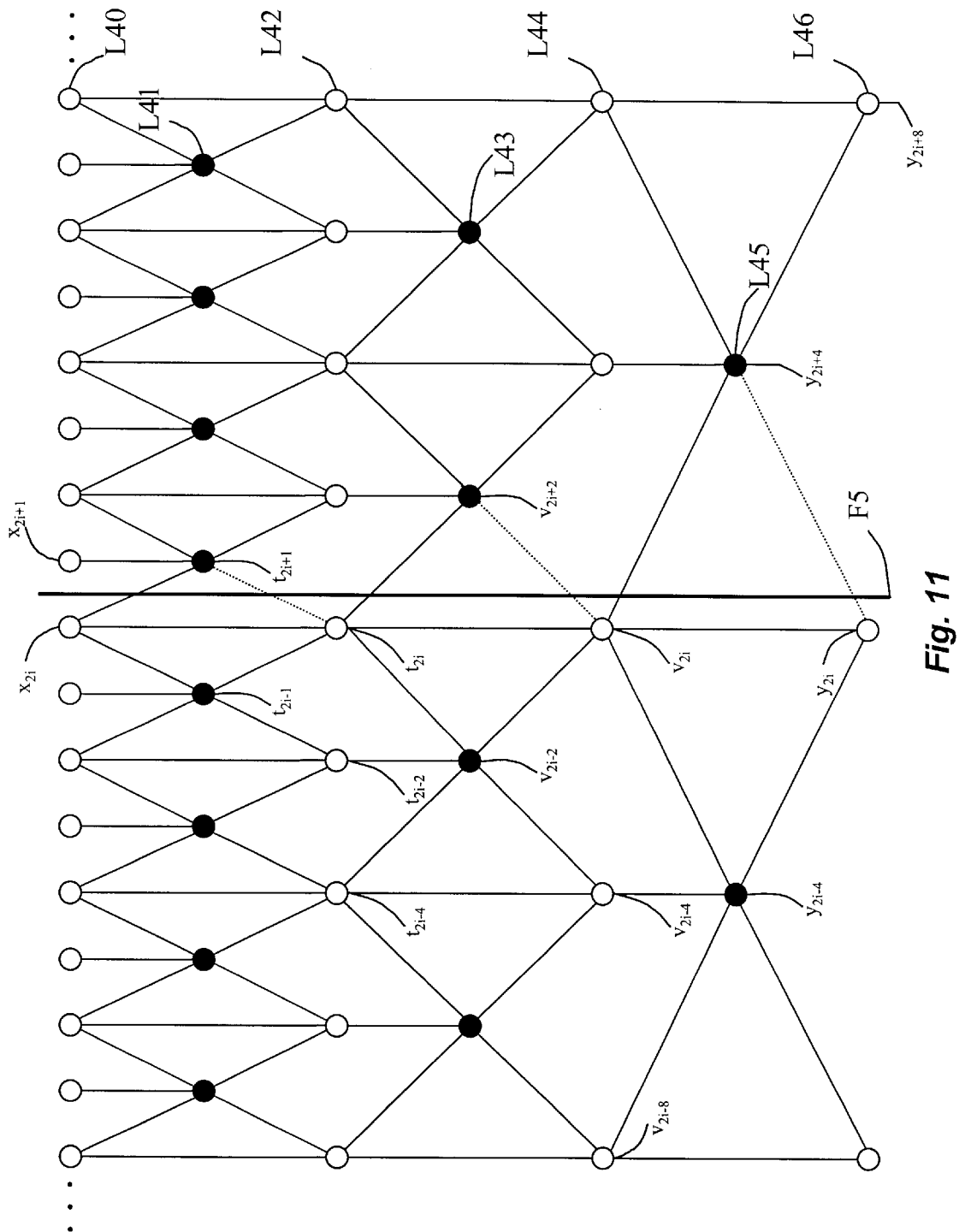
FIG. 11 is a trellis representing the functioning of a transformation circuit according to the invention.

FIG. 11 is a trellis representing the functioning of another transformation circuit which performs an analysis (dyadic decomposition) of a digital signal according to three resolution levels, in one dimension. The transformation circuit has two associated filters $H_0$ and $H_1$, respectively low pass and high pass.

The input samples are processed in an ordered fashion, in increasing rank.

As in FIG. 7, the filters chosen are 5/3 filters. By performing calculations similar to those previously presented, the following relationships are obtained between the samples of the trellis.

The first row L40 of the trellis includes the samples to be filtered $\{\ldots x_{2i}, x_{2i+1}, \ldots\}$, where the rank of the samples varies in steps of one. These samples are stored in the buffer memory 103 as they become useful for filtering.

The second row L41 of the trellis includes the high-frequency samples of the first resolution level $\{\ldots, t_{2i-1}, t_{2i+1}, \ldots\}$, where the rank of the samples varies in steps of two, obtained by the formula:

$$t_{2i+1}=x_{2i+1}-0.5.(x_{2i}+x_{2i+2}).$$

After it is calculated, the sample $t_{2i+1}$ is stored in buffer memory, in place of the sample with the same rank in the original signal.

The third row L42 of the trellis includes low-frequency samples of the first resolution level $\{\ldots, t_{2i-2}, t_{2i}, \ldots\}$, where the rank of the samples varies in steps of two, obtained by the formula:

$$t_{2i}=x_{2i}+0.25.(t_{2i-1}+t_{2i+1}).$$

After it is calculated, the sample $t_{2i}$ is stored in buffer memory, in place of the sample with the same rank in the original signal.

The fourth row L43 of the trellis includes the high-frequency samples of the second resolution level $\{\ldots, v_{2i-2}, v_{2i+2}, \ldots\}$, where the rank of the samples varies in steps of four, obtained by the formula:

$$v_{2i-2}=t_{2i-2}-0.5.(t_{2i}+t_{2i-4}).$$

After it is calculated, the sample $v_{2i-2}$ is stored in buffer memory, in place of the low-frequency sample of the first level with the same rank.

The fifth row L44 of the trellis includes the low-frequency samples of the second resolution level $\{\ldots, v_{2i-4}, v_{2i}, \ldots\}$, where the rank of the samples varies in steps of four, obtained by the formula:

$$v_{2i}=t_{2i}+0.25.(v_{2i-2}+v_{2i+2}).$$

After it is calculated, the sample $v_{2i}$ is stored in buffer memory, in place of the low-frequency sample of the first level with the same rank.

The sixth row L45 of the trellis includes the high-frequency samples of the third resolution level { ..., $y_{2i-4}$, $y_{2i+4}$, ... }, where the rank of the samples varies in steps of eight, obtained by the formula:

$$y_{2i-4}=v_{2i-4}-0.5.(v_{2i}+v_{2i-8}).$$

After it is calculated, the sample $y_{2i-4}$ is stored in buffer memory, in place of the low-frequency sample of the second level with the same rank.

The seventh row L46 of the trellis includes the low frequency samples of the third level { ..., $y_{2i}$, $y_{2i+8}$, ... }, where the rank of the sample varies in steps of eight, obtained by the formula:

$$y_{2i}=v_{2i}+0.25.(y_{2i-4}+y_{2i+4}).$$

After it is calculated, the sample $y_{2i}$ is stored in buffer memory, in place of the low-frequency sample of the second level with the same rank.

As before, only a predetermined maximum number of samples can be stored in memory 103. It is therefore necessary to cut the signal when this number is reached, to process the samples stored in memory 103, and then to recommence with the following series of samples.

The inventors found there also that the location of the boundary between two successive series of samples has an influence on the quality of reconstruction of the signal. More particularly, a boundary placed just after a low-frequency sample with the lowest resolution level in the decomposition limits any discontinuities which may appear when the signal is reconstructed.

In fact, the input signal is cut by the boundary F5, placed after the sample $x_{2i}$, that is to say after the low-frequency sample of the lowest level $y_{2i}$. The calculations previously presented are not affected up to the sample with the index 2i−1.

In order to determine the samples $t_{2i}$, $v_{2i}$ and $y_{2i}$, only samples up to the index 2i are available. The calculation of the samples $t_{2i}$, $v_{2i}$ and $y_{2i}$ is adapted so as to eliminate the branches cutting the boundary F5. For example, the sample $y_{2i}$ is thus determined only as a function of the samples $y_{2i-4}$ and $v_{2i}$.

When the following series of samples is processed, the samples are determined without the boundary F5 having any influence, that is to say no branch is eliminated because of the presence of the boundary F5, as from the sample with the index 2i+1.

Figure 12:
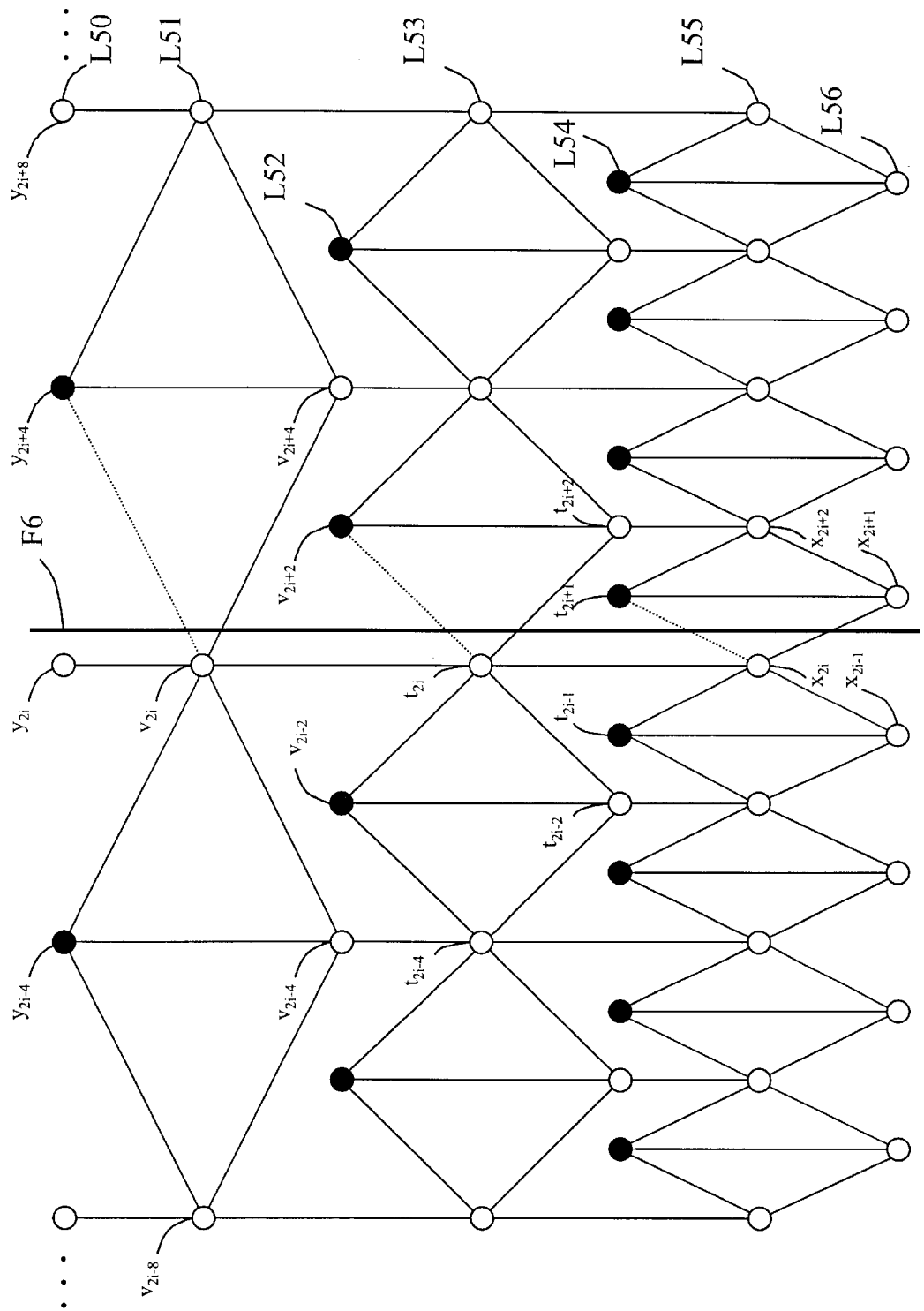
FIG. 12 is a trellis representing the functioning of the transformation circuit which is the inverse of that of FIG. 11.

FIG. 12 is a trellis representing the functioning of the inverse transformation circuit, or synthesis circuit corresponding to the trellis of FIG. 11.

The first row L50 of the trellis includes the low-frequency samples of the third resolution level { ..., $y_{2i}$, $y_{2i+8}$, }, where the rank of the samples varies in steps of eight, and the high-frequency samples of the third resolution level { ..., $y_{2i-4}$, $y_{2i+4}$, ... }, where the rank of the samples varies in steps of eight.

The second row L51 of the trellis includes the samples of even rank { ... $v_{2i-8}$, $v_{2i}$, ... }, where the rank of the samples varies in steps of eight, of the reconstructed low frequency signal, of the second resolution level, obtained by the formula:

$$v_{2i}=y_{2i}-0.25.(y_{2i-4}+y_{2i+4}).$$

After it is calculated, the sample $v_{2i}$ is stored in buffer memory, in place of the sample $y_{2i}$ with the same rank.

The third row L52 of the trellis includes the high-frequency samples of the second resolution level { ..., $v_{2i-2}$, $v_{2i+2}$, ... }, where the rank of the samples varies in steps of four, and the samples of odd rank { ..., $v_{2i-4}$, $v_{2i+4}$, ... }, where the rank of the sample varies in steps of eight, of the reconstructed low-frequency signal, of the second resolution level, obtained by the formula:

$$v_{2i-4}=y_{2i-4}+0.5.(v_{2i-8}+v_{2i}).$$

After it is calculated, the sample $v_2i_4$ is stored in buffer memory, in place of the sample $y_{2i-4}$ with the same rank.

The fourth row L53 of the trellis includes the samples of odd rank { ..., $t_{2i-4}$, $t_{2i}$, ... }, where the rank of the samples varies in steps of four, of the reconstructed low-frequency signal, of the first resolution level, obtained by the formula:

$$t_{2i}=v_2-0.25.(v_{2i-2}+v_{2i+2}).$$

After it is calculated, the sample $t_{2i}$ is stored in buffer memory, in place of the sample $v_{2i}$ with the same rank.

The fifth row L54 of the trellis includes the high-frequency samples of the first level { ..., $t_{2i-1}$, $t_{2i+1}$, ... }, where the rank of the samples varies in steps of two, and the samples of odd rank { ..., $t_{2i-2}$, $t_{2i+2}$, ... }, where the rank of the samples varies in steps of four, of the reconstructed low-frequency signal, of the first resolution level, obtained by the formula:

$$t_{2i-2}=v_{2i-2}+0.5.(t_{2i-4}+t_{2i}).$$

After it is calculated, the sample $t_{2i-2}$ is stored in buffer memory, in place of the sample $v_{2i-2}$ with the same rank.

The sixth row L55 of the trellis includes the samples of even rank { ... $x_{2i}$, $x_{2i+2}$, ... } of the reconstructed signal obtained by the formula:

$$x_{2i}=t_{2i}-0.25.(t_{2i-1}+t_{2i+1}).$$

After it is calculated, the sample $x_{2i}$ is stored in buffer memory, in place of the sample $t_{2i}$ with the same rank.

The seventh row L56 of the trellis includes the samples of odd rank { ..., $x_{2i-1}$, $x_{2i+1}$, ... } of the reconstructed signal obtained by the formula:

$$x_{2i+1}=t_{2i+1}+0.5.(x_{2i}+x_{2i+2}).$$

After it is calculated, the sample $x_{2i+1}$ is stored in buffer memory, in place of the sample $t_{2i+1}$ with the same rank.

As before, a boundary F6 is placed after the low-frequency sample of the lowest level $y_{2i}$. The calculations of the samples $v_{2i}$, $t_{2i}$ and $x_{2i}$ are adapted so as to eliminate, for each one, the branch cut by the boundary F6.

The calculations of the samples up to the index 2i−1, and as from the index 2i+1, are not affected by the boundary F6.

The coefficients calculated at the second step of each resolution level, that is to say here the coefficients calculated and depicted on rows L52, L54 and L56, are connected by branches to their neighbours, none of these branches being eliminated because of the presence of the boundary F6. Thus there is no discontinuity in the reconstructed signal because of the presence of the boundary F6.

Figure 13:
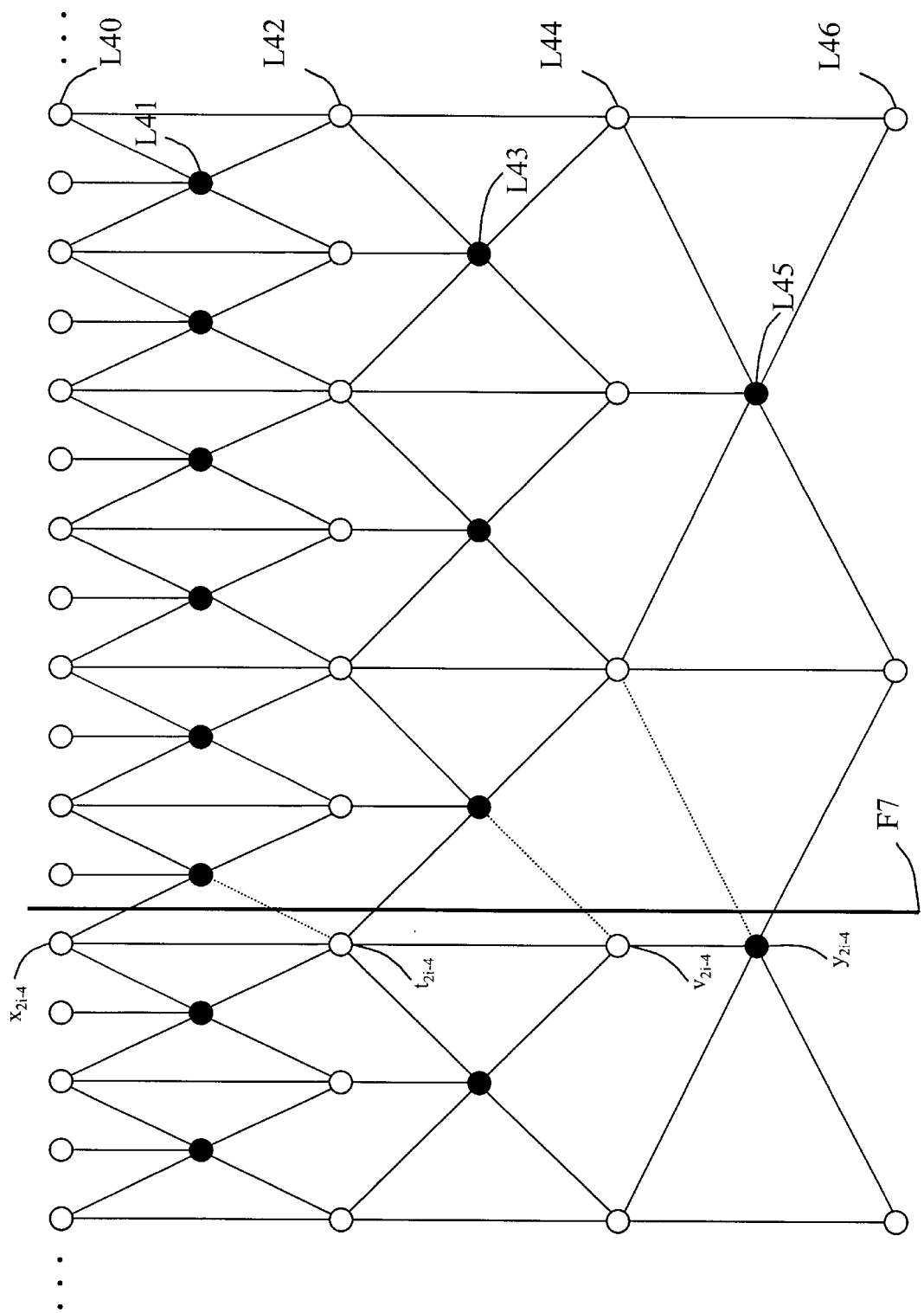
FIG. 13 is a trellis representing the functioning of a transformation circuit according to the invention.
Figure 14:
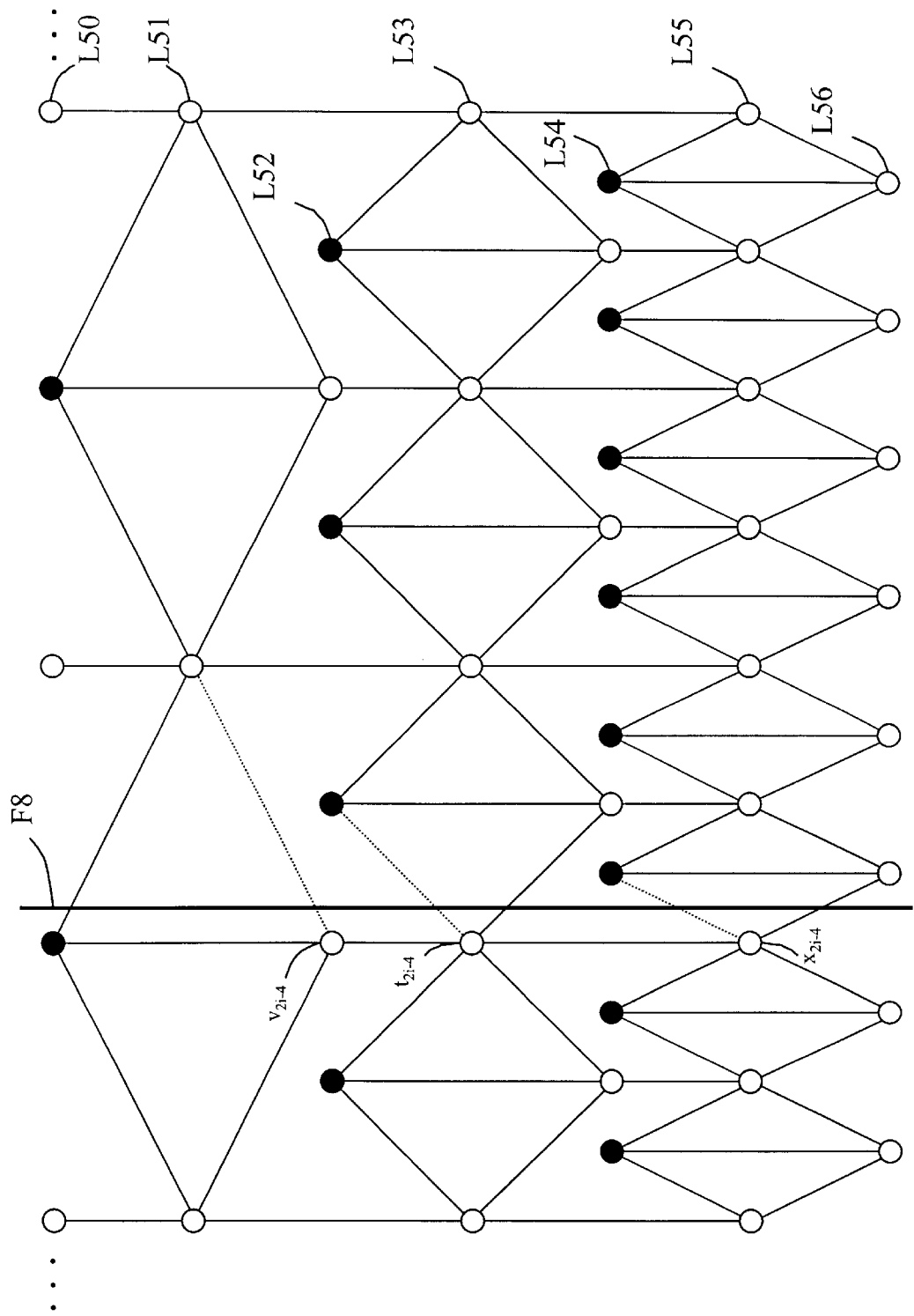
FIG. 14 is a trellis representing the functioning of the transformation circuit which is the inverse of that of FIG. 13.

FIGS. 13 and 14 are trellises identical respectively to those of FIGS. 11 and 12, except that the boundaries F7 and F8 are placed after a low-frequency sample $v_{2i-4}$ which belongs not to the lowest resolution level but to the immediately higher level.

In FIG. 13, the rows L40 to L46 are identical to those of FIG. 11. The calculations of the samples $t_{2i-4}$, $v_{2i-4}$ and $y_{2i-4}$ are adapted to the presence of the boundary F7, so as not to take account of the samples placed after the boundary F7, that is to say here the samples with an index greater than or equal to 2i−3.

Likewise, in FIG. 14, rows L50 to L56 are identical to those of FIG. 12. The boundary F8 is placed so as to cause changes corresponding to those of the boundary F7. The calculations of the samples $v_{2i−4}$, $t_{2i−4}$ and $x_{2i−4}$ are adapted to the presence in the boundary F8, so as not to take account of the samples placed after the boundary F8, that is to say here the samples with an index greater than or equal to 2i−3.

The inventors found that the signal reconstructed after analysis and synthesis according to the filters of FIGS. 13 and 14 have a little more distortion than the signal reconstructed after analysis and synthesis according to the filters of FIGS. 11 and 12.

This is due to the fact that the samples calculated and depicted in row L52 have an eliminated branch, unlike the case of FIG. 12, which generates distortion in the reconstructed signal.

Figure 15:
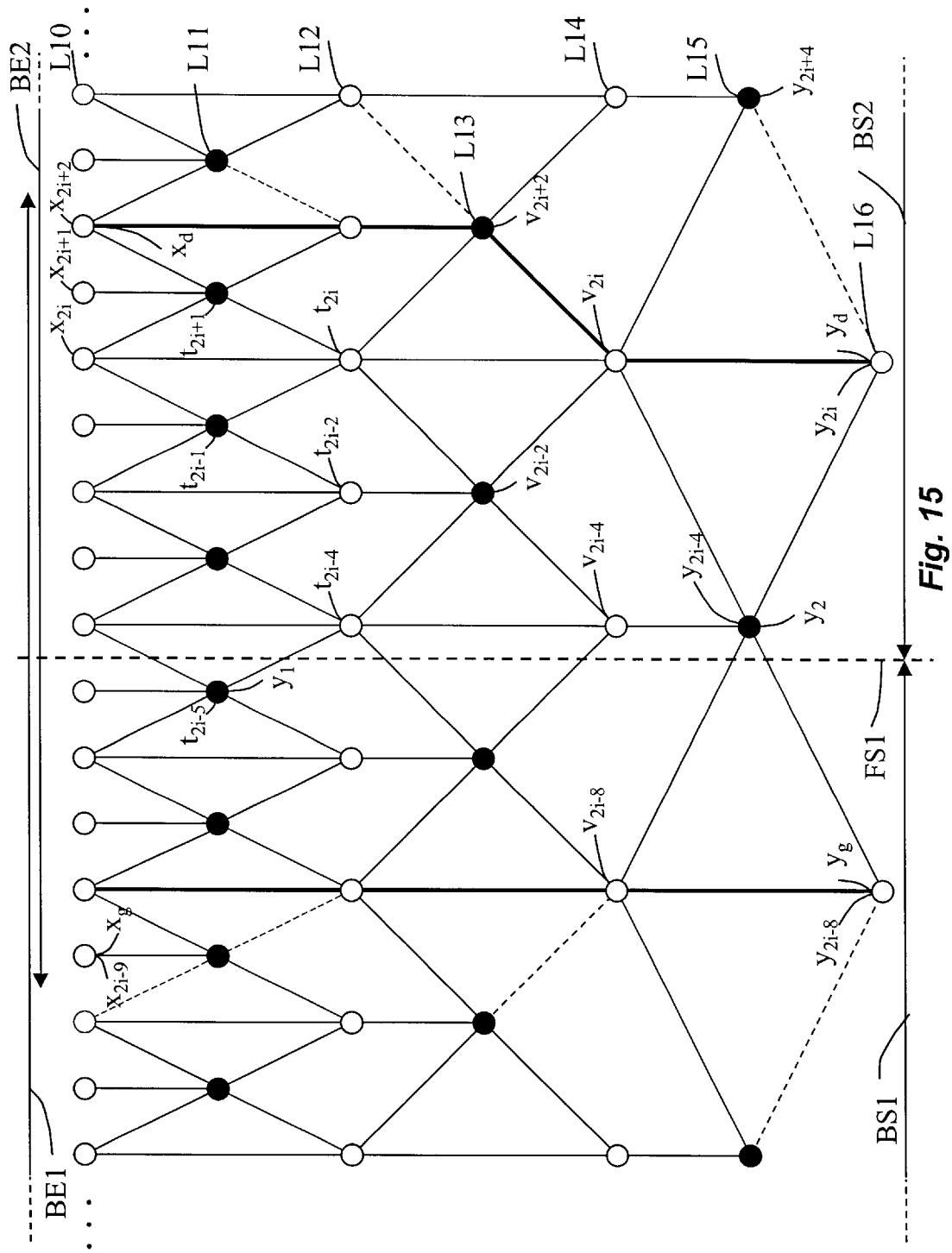
FIG. 15 is a trellis representing the functioning of a transformation circuit according to the invention.

FIG. 15 is a trellis representing the functioning of a transformation circuit which performs an analysis (dyadic decomposition) of a digital signal according to three resolution levels, in one dimension. The transformation circuit includes two associated filters $H_0$ and $H_1$, respectively low pass and high pass.

A portion of the signal to be transformed, here seventeen samples, has been depicted. It should be noted that each signal sample to be transformed can be a sample or can be a series of samples. According to one example, each sample is a row of a digital image. The filtering effected by trellis is then a vertical filtering of the image. As a variant, in an equivalent fashion, the samples are the columns of the image and the filtering is a horizontal filtering of the image.

The transformation circuit includes two associated filters $H_0$ and $H_1$, respectively low pass and high pass. The filters chosen are 5/3 filters, which can be represented by their samples:

$$H_0 = [-1\ 2\ 6\ 2\ -1]/8$$

$$H_1 = [3\ 1\ 1\ 2\ -1]/2$$

According to the so-called "lifting" method of Sweldens, the low-frequency filter $H_0$ can be expressed according to the high-frequency filter $H_1$, according to an equation of the type:

$$H_0 = [0\ 0\ 1\ 0\ 0] + \alpha.[1\ 0\ 1]*H_1$$

where $\alpha$ is a multiplying coefficient, equal to 0.25 for a 5/3 filter, and "*" represents the convolution operation. This type of decomposition is said to be reversible.

Accordingly, the low-frequency samples are calculated from the high-frequency samples and samples of the original signal.

Hereinafter:

$x_{2i−1}$, $x_{2i}$, $x_{2i+1}$, ... denote the samples of the signal to be transformed, where i is an integer, $y_{2−1}$, $y_{2i}$, $y_{2i+1}$, ... denote the samples obtained by transformation.

The samples with even indices are here the low-frequency samples, and the samples with odd indices are the high-frequency samples.

The index of a sample represents its rank in the ordered series forming the signal.

The calculations performed in the transformation circuit are calculations in place, that is to say a calculated sample, of given rank, is stored in place of another sample with the same rank used for calculating it.

In addition, the samples of the signal to be transformed are processed in an ordered fashion, in increasing rank.

The first row L10 of the trellis includes the samples to be filtered $\{\ldots, x_{2i}, x_{2i+1}, \ldots\}$, where the rank of the samples varies in steps of one. These samples are stored in the buffer memory 103 as they become useful for the filtering.

The second row L11 of the trellis includes the high-frequency samples with the first resolution level $\{\ldots, t_{2i−1}, t_{2i+1}, \ldots\}$, where the rank of the samples varies in steps of two, obtained by the formula:

$$t_{2i+1} = x_{2i+1} − 0.5.(x_{2i} + x_{2i+2}).$$

After it is calculated, the sample $t_{2i+1}$ is stored in the buffer memory, in place of the sample with the same rank in the original signal.

The third row L12 of the trellis includes the low-frequency samples with the first resolution level $\{\ldots, t_{2i−2}, t_{2i}, \ldots\}$, where the rank of the samples varies in steps of two, obtained by the formula:

$$t_{2i} = x_{2i} + 0.25.(t_{2i+1} + t_{2i−1}).$$

After it is calculated, the sample $t_{2i}$ is stored in the buffer memory, in place of the sample with the same rank in the original signal.

The fourth row L13 of the trellis includes the high-frequency samples with the second resolution level $\{\ldots, v_{2i−2}, v_{2i+2}, \ldots\}$, where the rank of the samples varies in steps of four, obtained by the formula:

$$v_{2i−2} = t_{2i−2} − 0.5.(t_{2i} + t_{2i−4}).$$

After it is calculated, the sample $v_{2i−2}$ is stored in the buffer memory, in place of the low-frequency sample of the first level with the same rank.

The fifth row L14 of the trellis includes the low-frequency samples of the second resolution level $\{\ldots, v_{2i−4}, v_{2i}, \ldots\}$, where the rank of the samples varies in steps of four, obtained by the formula:

$$v_{2i} = t_{2i} + 0.25.(v_{2i−2} + v_{2i+2}).$$

After it is calculated, the sample $v_{2i}$ is stored in the buffer memory, in place of the low-frequency sample of the first level with the same rank.

The sixth row L15 of the trellis includes the high-frequency samples of the third resolution level $\{\ldots, y_{2i−4}, y_{2i+4}, \ldots\}$, where the rank of the samples varies in steps of eight, obtained by the formula:

$$y_{2i−4} = v_{2i−4} − 0.5.(v_{2i} + v_{2i−8}).$$

After it is calculated, the sample $y_{2i−4}$ is stored in the buffer memory, in place of the low-frequency sample of the second level with the same rank.

The seventh row L16 of the trellis includes the low-frequency samples of the third level $\{\ldots, y_{2i−8}, y_{2i}, \ldots\}$, where the rank of the samples varies in steps of eight, obtained by the formula:

$$y_{2i} = v_{2i} + 0.25.(y_{2i−4} + y_{2i+4}).$$

After it is calculated, the sample $y_{2i}$ is stored in the buffer memory, in place of the low-frequency sample of the second level with the same rank.

The result of the transformation of the original signal $\{\ldots, x_{2i}, x_{2i+1}, \ldots\}$ by the 5/3 filters is an interlaced signal.

Naturally, it is possible to perform similar operations on a different number of samples, on a different number of resolution levels, or to use other filters on one or more of the resolution levels.

In practice, only a maximum predetermined number of samples can be stored in memory 103. It is therefore necessary to process the signal by successive blocks of samples.

However, any processing, such as quantization or entropic coding, performed on the signal between its analysis and its synthesis may cause discontinuities during synthesis, because of the processing by block.

In order to avoid these discontinuities on reconstruction of the signal, an overlap is necessary between two adjacent blocks. Two adjacent blocks overlap over a predetermined number of samples.

The present invention concerns particularly the formation of the blocks, and the manner of positioning the limits of the blocks in order to ensure an overlap between the adjacent blocks.

For this purpose, a first limit, referred to as the left-hand limit, is first of all defined. A sample denoted $x_g$ is chosen in the first row L10. From the sample $x_g$, the left-hand limit is formed by passing to the following row L11 following a branch to a sample of rank equal or greater to that of the sample $x_g$. In the example depicted in FIG. 15 the rank is equal to that of the sample $x_g$.

Next, the same rule is applied for passing from one row to the following one, as far as a sample $y_g$ in the last row L16 of the trellis. Thus, passing from a sample in a given row to a sample of equal or greater rank in the following row, a left-hand limit is formed. The left-hand limit is formed by passing successively from a previous sample to a following sample calculated according to the previous sample. It should be noted that the limit using the sample $x_g$ is not unique.

In an equivalent manner, a second limit is defined, referred to as the right-hand limit. A sample denoted $x_d$ is chosen in the first row L10. From the sample $x_d$, the right-hand limit is formed by passing to the following row L11 following a branch to a sample of rank less than or equal to that of the sample $x_d$.

Next, the same rule is applied for passing from one row to the following one, as far as a sample $y_d$ in the last row L16 in the trellis. Thus, by passing from a sample in a given row to a sample of lower or equal rank in the following row, a right-hand limit is formed. The right-hand limit is formed by passing successively from a previous sample to a following sample calculated according to the previous sample.

A considered sample, any one in the trellis, can be situated to the left or respectively to the right of the limit, whether it be right or left, if its rank is below, or respectively greater than, the rank of the sample belonging to the limit and to the same row as the sample under consideration.

In addition, any sample will be said to be strictly to the left or respective strictly to the right of a limit if its rank is strictly below, or respectively strictly greater than, the rank of the sample belonging to the limit and to the same row as the sample under consideration.

Said any sample will be said to be left or respectively right in the broad meaning of a limit if its rank is less than or equal, or respectively greater than or equal, to the rank of the sample belonging to the limit and to the same row as the sample under consideration.

In addition, a left-hand limit and a right-hand limit are said to be compatible when no sample in the trellis is situated both strictly to the left of the left-hand limit and strictly to the right of the right-hand limit, that is to say, in other words, when there is no compatibility sample having a rank strictly lower than the rank of the sample belonging to the start limit of the first following input block and to the same row as the compatibility sample, and at the same time a rank strictly greater than the rank of the sample belonging to the end limit of the first input block considered and to the same row as the compatibility sample.

The right-hand limit determines the end of a first input block BE1. In this block, the samples as far as the right-hand limit inclusive are used for making the calculations, the following samples being "unknown". The branches which connect unknown samples to samples belonging to the block BE1, which are consequently to be calculated, are eliminated. The eliminated branches, three in number in the example depicted, are in dotted lines.

In an equivalent manner, the left-hand limit determines the start of a second input block BE2. In this block, the samples as from the left-hand limit inclusive are used for making the calculations, the previous samples being "unknown". The branches which connect unknown samples to samples belonging to block BE2, which are consequently to be calculated, are eliminated. The eliminated branches, three in number in the example depicted, are in dotted lines.

The left-hand and right-hand limits are compatible, within the meaning defined above.

As disclosed below, the calculations are adapted as a consequence of the elimination of branches.

The input blocks BE1 and BE2 thus overlap between samples $x_g$ and $x_d$.

In order to determine the output blocks BS1 and BS2 corresponding respectively to the input blocks BE1 and BE2, two samples $y_1$ and $y_2$ are chosen, complying with the following properties:
- the samples $y_1$ and $y_2$ are of consecutive ranks,
- the sample $y_1$ has a position such that all the samples of the trellis which have a rank below or equal to the rank of the sample $y_1$ are to the left of the right-hand path, within the broad meaning of the term, that is to say possibly on the right-hand limit,
- the sample $y_2$ has a position such that all the samples of the trellis which have a rank greater than or equal to the rank of the sample $y_2$ are to the right of the left-hand path within the broad meaning of the term, that is to say possibly on the left-hand limit.

The boundary FS1 between the output blocks BS1 and BS2 is placed between the samples $y_1 = t_{2i-5}$ and $y_2 = y_{2i-4}$.

Figure 16:
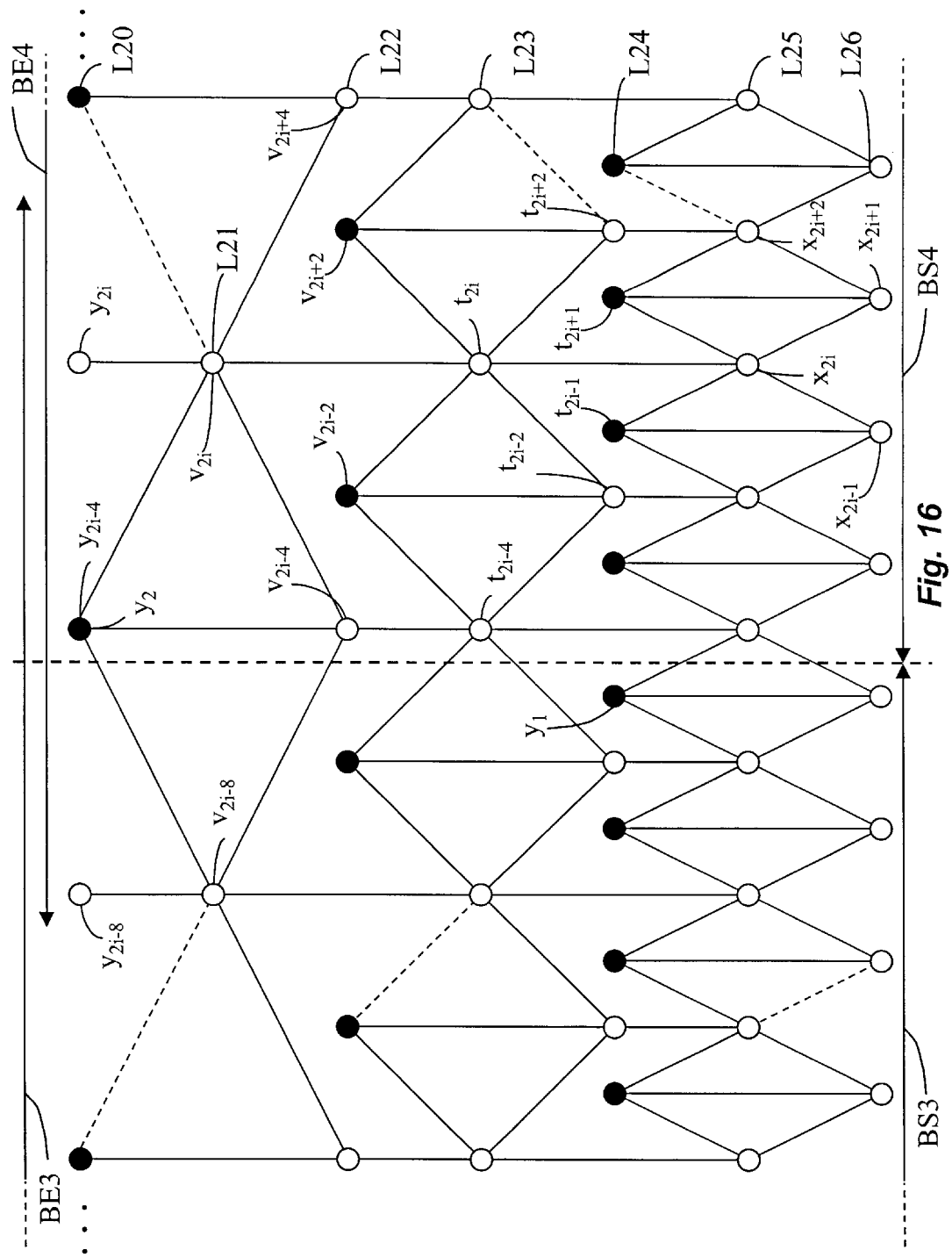
FIG. 16 is a trellis representing the functioning of the transformation circuit which is the inverse of that of FIG. 15.

FIG. 16 is a trellis representing the functioning of the inverse transformation circuit, or synthesis circuit, corresponding to the trellis of FIG. 15. The samples to be filtered are here the interlaced high and low frequency samples obtained after analysis filtering of a digital image. These samples have possibly been modified by another processing between analysis and synthesis.

The first row L20 of the trellis includes the low-frequency samples of the third resolution level $\{ \ldots, y_{2i-8}, y_{2i}, \ldots \}$, where the rank of the samples varies in steps of eight and the high-frequency samples of the third resolution level $\{ \ldots y_{2i-4}, y_{2i+4}, \ldots \}$, where the rank of the samples varies in steps of eight.

The second row L21 of the trellis includes the samples of even rank $\{ \ldots, v_{2i-8}, v_{2i}, \ldots \}$, where the rank of the samples varies in steps of eight, of the reconstructed low-frequency signal, of the second resolution level, obtained by the formula:

$$v_{2i} = y_{2i} - 0.25 \cdot (y_{2i-4} + y_{2i+4}).$$

After it is calculated, the sample $v_{2i}$ is stored in the buffer memory, in place of the sample $y_{2i}$ with the same rank.

The third row L22 of the trellis includes the high-frequency samples of the second resolution level { ..., $v_{2i-2}$, $v_{2i+2}$, ... }, where the rank of the samples varies in steps of four, and the samples of odd rank { ..., $v_{2i-4}$, $v_{2i+4}$, ... }, where the rank of the samples varies in steps of eight, of the reconstructed low-frequency signal, of the second resolution level, obtained by the formula:

$$v_{2i-4} = y_{2i-4} + 0.5 \cdot (v_{2i-8} + v_{2i}).$$

After it is calculated, the sample $v_{2i-4}$ is stored in the buffer memory, in place of the sample $y_{2i-4}$ with the same rank.

The fourth row L23 of the trellis includes the samples of even rank { ..., $t_{2i-4}$, $t_{2i}$, ... }, where the rank of the samples varies in steps of four, of the reconstructed low-frequency signal, of the first resolution level, obtained by the formula:

$$t_{2i} = v_{2i} - 0.25 \cdot (v_{2i-2} + v_{2i+2}).$$

After it is calculated, the sample $t_2i$ is stored in the buffer memory, in place of the sample $v_{2i}$ with the same rank.

The fifth row L24 of the trellis includes the high-frequency samples of the first level { ..., $t_{2i-1}$, $t_{2i+1}$, ... }, where the rank of the samples varies in steps of two, and the samples of odd rank { ..., $t_{2i-2}$, $t_{2i+2}$, ... }, where the rank of the samples varies in steps of four, of the reconstructed low-frequency signal, of the first resolution level, obtained by the formula:

$$t_{2i-2} = v_{2i-2} + 0.5 \cdot (t_{2i-4} + t_{2i}).$$

After it is calculated, the sample $t_{2i-2}$ is stored in the buffer memory, in place of the sample $v_{2i-2}$ with the same rank.

The sixth row L25 of the trellis includes the samples of even rank { ..., $x_{2i}$, $x_{2i+2}$, ... } of the reconstructed signal obtained by the formula:

$$x_{2i} = t_{2i} - 0.25 \cdot (t_{2i-1} + t_{2i+1}).$$

After it is calculated, the sample $x_{2i}$ is stored in the buffer memory, in place of the sample $t_{2i}$ of the same rank.

The seventh row L26 of the trellis includes the samples of odd rank { ..., $x_{2i-1}$, $x_{2i+1}$, ... } of the reconstructed signal obtained by the formula:

$$x_{2i+1} = t_{2i+1} + 0.5 \cdot (x_{2i} + x_{2i+2}).$$

After it is calculated, the sample $x_{2i+1}$ is stored in the buffer memory, in place of the sample $t_{2i+1}$ of the same rank.

As before, the signal is processed by blocks of samples. The same considerations concerning the ends of the block and the block overlaps apply.

In addition, the boundaries at the start and ends of blocks are placed in a manner corresponding to the analysis, in order to ensure, in the case of reversible decompositions, the perfect reconstruction of the signal in the absence of processing between analysis and synthesis. Thus the eliminated branches correspond to the branches eliminated on analysis and, in other words, the calculations are adapted in a manner corresponding to analysis.

An input block BE3 ends after the sample $v_{2i+2}$, a following input block BE4 commences from the sample $y_{2i-8}$. The input blocks BE3 and BE4 overlap between the samples of rank 2i−8 and 2i+2.

Likewise, adjacent output blocks BS3 and BS4 are formed. The output blocks BS3 and BS4 correspond to the output blocks BS1 and BS2. The output block BS3 terminates after the rank 2i−5 and the block BS4 commences as from the rank 2i−4.

Branches are eliminated, and consequently the calculations of certain samples are modified, in a manner corresponding to the analysis.

Figure 17:
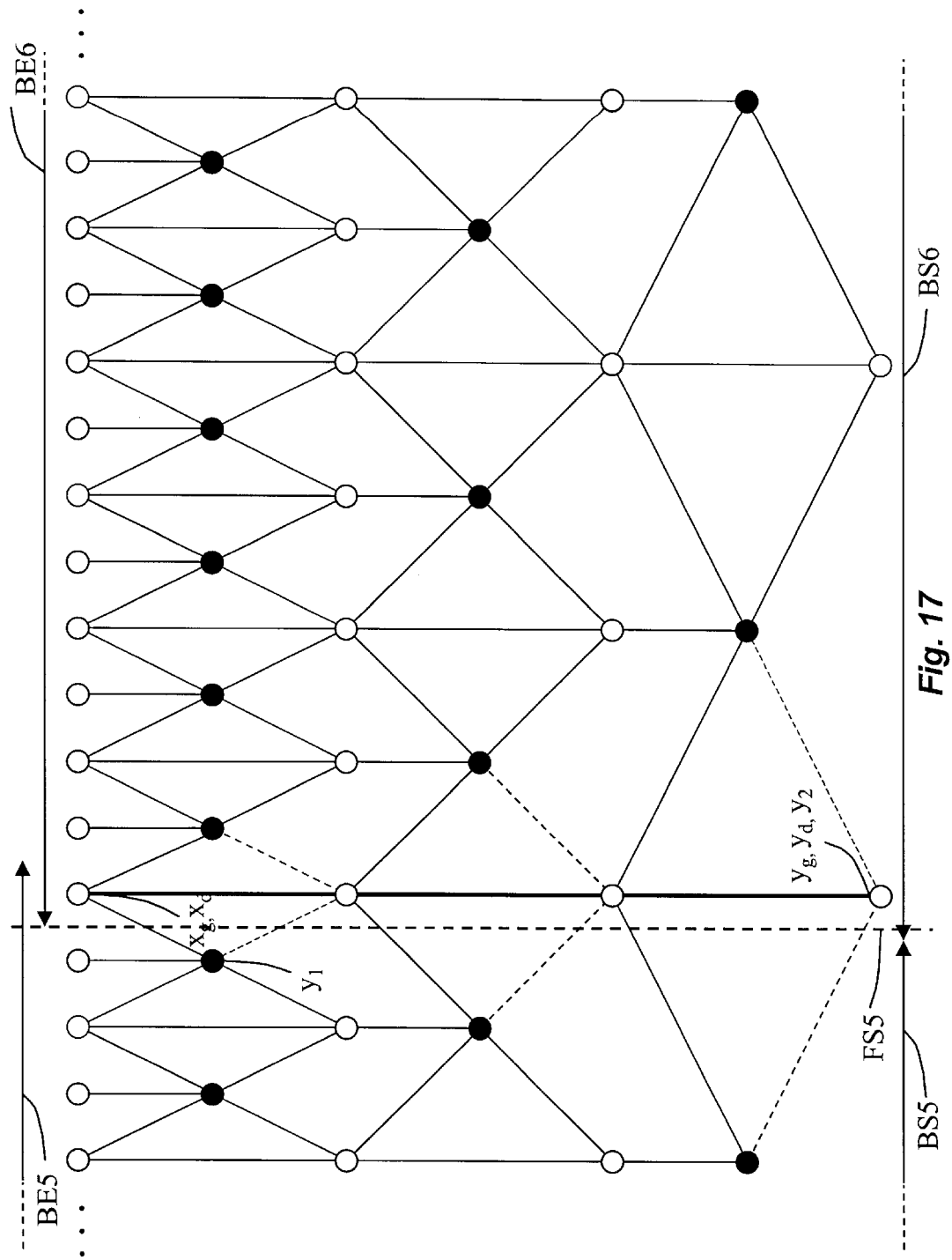
FIG. 17 is a trellis representing the functioning of a transformation circuit according to the invention.
Figure 18:
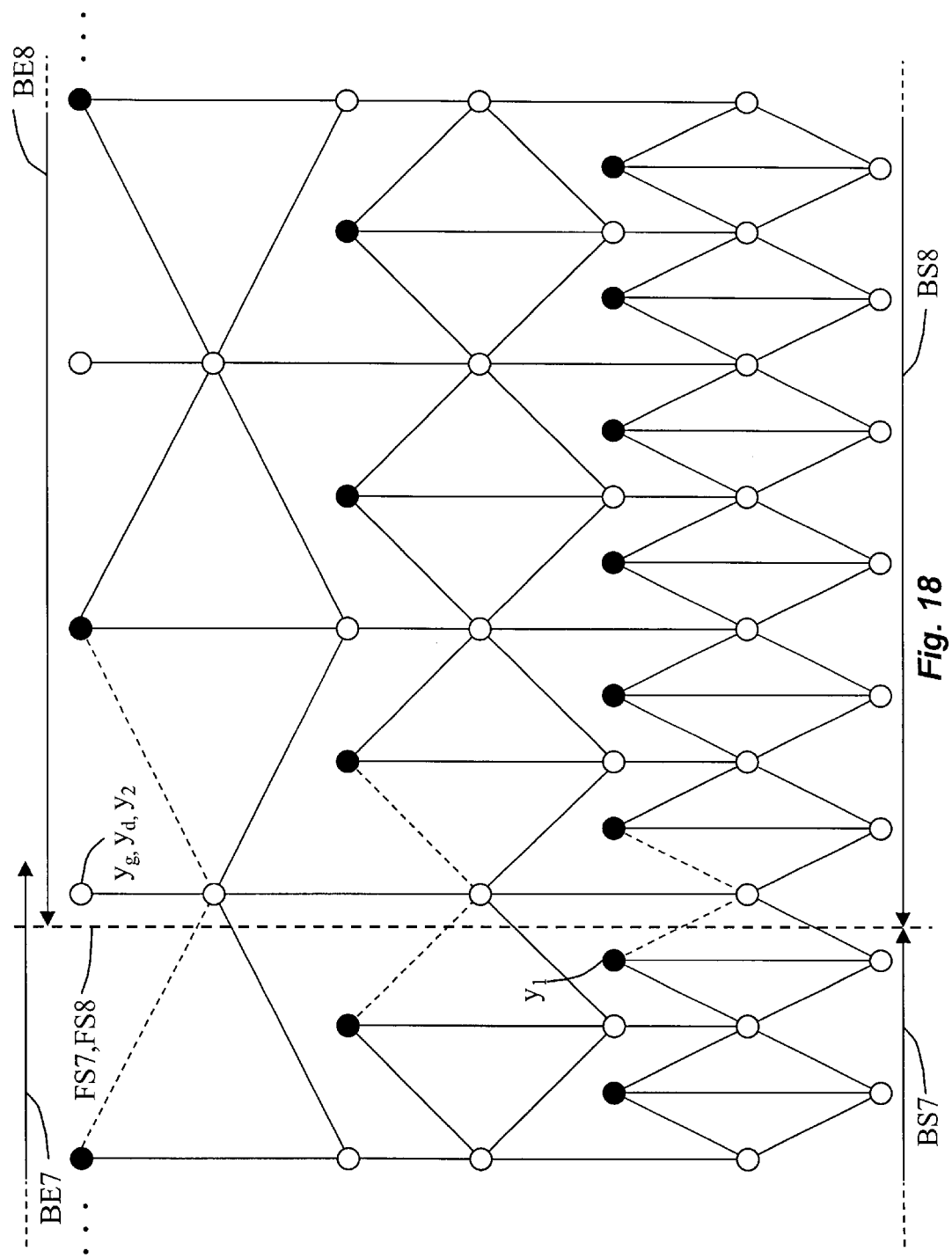
FIG. 18 is a trellis representing the functioning of the transformation circuit which is the inverse of that of FIG. 17.

FIGS. 17 and 18 are trellises identical respectively to those of FIGS. 15 and 16, except that the blocks overlap on only one sample, which constitutes the smallest overlap and consequently minimises the memory occupation. This case is applicable for odd filters.

In FIG. 17, the left and right paths are merged, and are formed from the same sample $x_g = x_d$. Consequently, the left and right paths contain only samples of the same rank.

The input blocks BE5 and BE6 are formed, and overlap solely on the input sample $x_g = x_d$.

The input sample $x_g = x_d$ has the same rank as a calculated sample which is a low-frequency sample. In addition, this calculated sample is here an output sample, that is to say a low-frequency sample of the lowest resolution level.

When the input block BE5 is processed, three branches are eliminated and the calculations are adapted accordingly.

Likewise, when the input block BE6 is processed, three branches are eliminated and the calculations are adapted accordingly.

Adjacent output blocks BS5 and BS6 are also formed. The boundary FS5 between the output blocks BS5 and BS6 is situated just before the output sample having the same rank as the input sample $x_g = x_d$. In an equivalent fashion, the boundary could be just after this sample.

FIG. 18 is a trellis representing the functioning of the inverse transformation circuit, or synthesis circuit corresponding to the trellis of FIG. 17.

Thus two input blocks BE7 and BE8 overlap on an input sample.

Calculation branches are eliminated, and the calculations adapted, in the manner corresponding to the analysis.

Adjacent output blocks BS7 and BS8 are formed. Their boundary is placed just before the output sample of the same rank as the overlapping sample.

Details will now be given on the way in which the calculations are adapted when a calculation branch is eliminated. The concern is consequently with the weighting coefficients associated with the branches.

Figure 19:
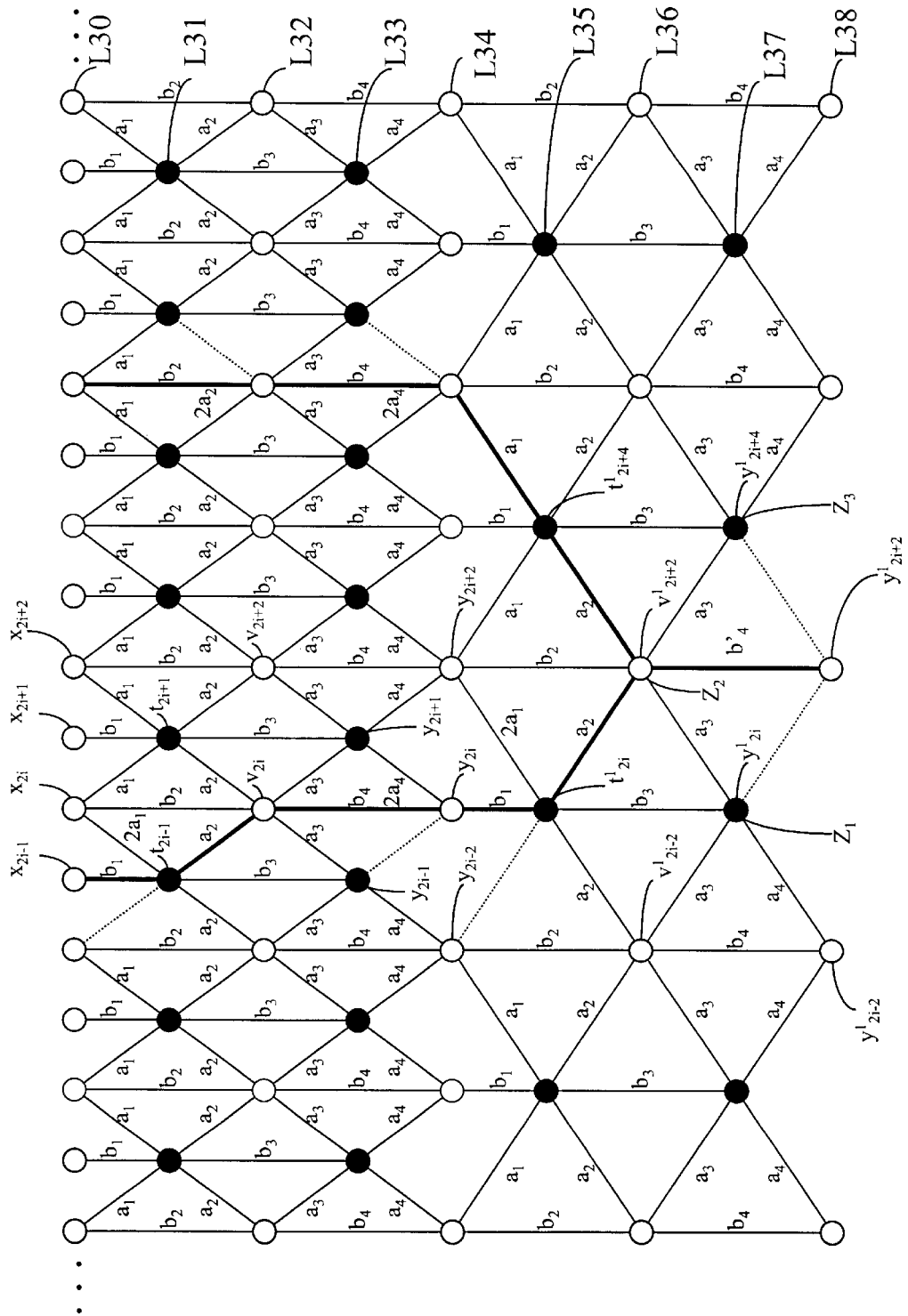
FIG. 19 is a trellis representing the functioning of a transformation circuit according to the invention.

FIG. 19 is a trellis representing the functioning of another transformation circuit which effects an analysis of a digital signal according to two dyadic decomposition levels, in one dimension. The transformation circuit has two associated filters $H_0$ and $H_1$, respectively low pass and high pass.

The input samples are processed in an ordered fashion, in increasing rank.

According to the embodiment chosen, the chosen filters are 9/7 filters, for example those disclosed in the article "Ten lectures on wavelets", by Ingrid DAUBECHIES, CBMS-NSF Regional Conference Series in Applied Mathematics Vol. 61 SIAM, Journal of Mathematics Anal. Philadelphia Pa. 1992.

By performing calculations similar to those previously presented, the following relationships are obtained between the samples of the trellis.

The first row L30 of the trellis includes the samples to be filtered { ..., $x_{2i}$, $x_{2i+1}$, ... }, where the step of the samples varies in steps of one. These samples are stored in a buffer memory 103 as they become useful for filtering.

Hereinafter, $a_1$, $b_1$, $a_2$, $b_2$, $a_3$, $b_3$, $a_4$ and $b_4$ are real coefficients, whose values are given by way of example. In all cases, the coefficients $b_1$, $b_2$ and $b_3$ are non-nil.

The second row L31 of the trellis is a first stage for the first decomposition level and includes intermediate samples $\{\ldots, t_{2i-1}, t_{2i+1}, \ldots\}$, where the step of the samples varies in steps of two, obtained by means of the formula:

$$t_{2i+1} = b_1 \cdot x_{2i+1} + a_1 \cdot (x_{2i} + x_{2i+2}),$$

that is to say, in a particular case:

$$t_{2i+1} = x_{2i+1} - 1.586134 \cdot (x_{2i} + x_{2i+2}).$$

After it is calculated, the sample $t_{2i+1}$ is stored in the buffer memory, in place of the sample of the same rank in the original signal.

The third row L32 of the trellis is a second stage for the first decomposition level and includes intermediate samples $\{\ldots, v_{2i}, v_{2i+2}, \ldots\}$, where the step of the samples varies in steps of two, obtained by means of the formula:

$$v_{2i} = b_2 \cdot x_{2i} + a_2 \cdot (t_{2i-1} + t_{2i-1}), \text{ that is to say}$$

$$v_{2i} = x_{2i} - 0.052980 \cdot (t_{2i+1} + t_{2i-1}).$$

After it is calculated, the sample $v_{2i}$ is stored in the buffer memory, in place of the sample with the same rank in the original signal.

The fourth row L33 of the trellis is a third stage for the first decomposition level and includes the high frequency samples of the first level $\{\ldots y_{2i-1}, y_{2i+1}, \ldots\}$, where the step of the samples varies in steps of two, obtained by means of the formula:

$$y_{2i+1} = b_3 \cdot t_{2i+1} + a_3 \cdot (v_{2i} + v_{2i+2}), \text{ that is to say}$$

$$y_{2i+1} = t_{2i+1} + 0.882911 \cdot (v_{2i} + v_{2i+2}).$$

After it is calculated, the sample $y_{2i+1}$ is stored in the buffer memory, in place of the intermediate sample of the same rank.

The fifth row L34 of the trellis is a fourth stage for the first decomposition level and includes the low-frequency samples of the first level $\{\ldots, y_{2i}, y_{2i+2}, \ldots\}$, where the step of the samples varies in steps of two, obtained by means of the formula:

$$y_{2i} = b_4 \cdot v_{2i} + a_4 \cdot (y_{2i+1} + y_{2i-1}), \text{ that is to say}$$

$$y_{2i} = v_{2i} + 0.443507 \cdot (y_{2i+1} + y_{2i-1}).$$

After it is calculated, the sample $y_{2i}$ is stored in the buffer memory, in place of the intermediate sample with the same rank.

The samples $y_{2i}$ and $y_{2i+1}$ are then normalized. In order to simplify the notations, the normalized samples are referenced $y_{2i}$ and $y_{2i+1}$. These normalization formulae are:

$$y_{2i} = y_{2i}/K_0$$

$$y_{2i+1} = y_{2i+1} \cdot K_1$$

where $K_0$ and $K_1$ are normalization factors equal to 0.869865 for these 9/7 filters.

After they are calculated, these samples are stored in the buffer memory 103 in place of the initial samples $y_{2i}$ and $y_{2i+1}$.

The samples used for the second decomposition level are now the normalized samples.

The sixth row L35 of the trellis is a first stage for the second decomposition level and includes intermediate samples $\{\ldots, t^1_{2i}, t^1_{2i+4}, \ldots\}$, where the step of the samples varies in steps of four, obtained by means of the formula:

$$t^1_{2i} = b_1 \cdot y_{2i} + a_1 \cdot (y_{2i-2} + y_{2i+2}), \text{ that is to say}$$

$$t^1_{2i} = y_{2i} - 1.586134 \cdot (y_{2i-2} + y_{2i+2}).$$

After it is calculated, the sample $t^1_{2i}$ is stored in the buffer memory, in place of the sample $y_{2i}$ of the same rank.

The seventh row L36 of the trellis is a second stage for the second decomposition level and includes immediate samples $\{\ldots, v^1_{2i-2}, v^1_{2i+2}, \ldots\}$, where the step of the samples varies in steps of four, obtained by means of the formula:

$$v^1_{2i+2} = b_2 \cdot y_{2i+2} + a_2 \cdot (t^1_{2i} + t^1_{2i+4}), \text{ that is to say}$$

$$v^1_{2i+2} = y_{2i+2} - 0.052980 \cdot (t^1_{2i} + t^1_{2i+4}).$$

After it is calculated, the sample $v^1_{2i+2}$ is stored in the buffer memory, in place of the sample $y_{2i+2}$ with the same rank.

The eighth row L37 of the trellis is a third stage for the second decomposition level and includes the high-frequency samples of the second level $\{\ldots, y^1_{2i}, y^1_{2i+4}, \ldots\}$, where the step of the samples varies in steps of four, obtained by means of the formula:

$$y^1_{2i} = b_3 \cdot t^1_{2i} + a_3 \cdot (v^1_{2i-2} + v^1_{2i+2}), \text{ that is to say}$$

$$y^1_{2i} = t^1_{2i} + 0.882911 \cdot (v^1_{2i-2} + v^1_{2i+2}).$$

After it is calculated, the sample $y^1_{2i}$ is stored in the buffer memory, in place of the intermediate sample with the same rank.

The ninth row L38 of the trellis is a fourth stage for the second decomposition level and includes the low-frequency samples of the second level $\{\ldots, y^1_{2i-2}, y^1_{2i+2}, \ldots\}$, where the step of the samples varies in steps of four, obtained by means of the formula:

$$y^1_{2i+2} = b_4 \cdot v^1_{2i+2} + a_4 \cdot (y^1_{2i} + y^1_{2i+4}), \text{ that is to say}$$

$$y^1_{2i+2} = v^1_{2i+2} + 0.443507 \cdot (y^1_{2i} + y^1_{2i+4}).$$

After it is calculated, the sample $y^1_{2i+2}$ is stored in the buffer memory, in place of the intermediate sample of the same rank.

The samples $y^1_{2i}$ and $y^1_{2i+2}$ are then normalized. In order to simplify the notations, the normalized samples are referenced $y^1_{2i}$ and $y^1_{2i+2}$. The normalization formulae are:

$$y^1_{2i} = y_{2i} \cdot K_1$$

$$y^1_{2i+2} = y^1_{2i+2}/K_0$$

where $K_0$ and $K_1$ are equal to 0.869865.

After they are calculated, these samples are stored in the buffer memory 103 in place of the initial samples $y^1_{2i}$ and $y^1_{2i+2}$.

The result of the transformation, here a dyadic decomposition of two levels, of the original signal $\{\ldots, x_{2i}, x_{2i+1},\}$ by the 9/7 filters is an interlaced signal of the form: $\{\ldots, y^1_{2i-2}, y_{2i-1}, y^1_{2i}, y_{2i+1}, y^1_{2i+2}, \ldots\}$, that is to say having a succession of samples which are low frequency of the second level, high frequency of the first level, high frequency of the second level, high frequency of the first level, and so on.

As before, input and output blocks are formed and branches are eliminated for the calculations of certain samples.

Here central branch means a branch connecting two samples with the same rank and belonging to two different rows, and non-central branch means a branch connecting two samples of different ranks and belonging to different rows.

It should be noted that the eliminated branches are not central.

In order to preserve the normalization properties of the reversible decompositions, the elimination of a branch gives rise to the modification of the coefficient of at least one other branch.

The modification relating to the elimination of a branch is effected on the central branch resulting in the same sample as the eliminated branch.

For example, in FIG. 19, the calculation of the sample $z_4 = y^1_2 i+_2$ is modified in order to take account of the elimination of the branches coming from the samples $z_1 = y^1_{2i}$ and $z_3 = y^1_{2i+4}$.

A total weight P is defined for a sample considered as the value that this sample would have if all the samples of the previous low sub-band all equalled one. The previous low sub-band can be an original signal. For the samples $z_1$, $z_2 = v^1_{2i+2}$ and $z_3$, the previous low sub-band is on row L34.

Thus for example:

$$P(z_1) = b_3.(b_1+2.a_1) + 2.a_3.(b_2+2.a_2.(b_1+2.a_1))$$

$$P(z_2) = b_2 + 2.a_2.(b_1+2.a_1)$$

$$P(z_3) = b_3.(b_1+2.a_1) + 2.a_3.(b_2+2.a_2.(b_1+2.a_1))$$

When a non-central branch is eliminated, the weighting coefficient of the central branch resulting in the same sample is modified by adding to it the product of the total weight of the sample from which the eliminated branch issued with the weighting coefficient of this eliminated branch, this product also being divided by the weight of the sample from which the central branch issued.

Thus, in order to take account of the elimination of the two branches coming from the samples $z_1$ and $z_3$, the modified weighting coefficient $b'_4$ of the branch leading to the sample $y^1_{2i+2}$ is equal to:

$$b_4 + a_4.P(z_1)/P(z_2) + a_4.P(z_3)/P(z_2).$$

It should be noted that, for the other eliminated non-central branches, the weighting coefficient of each eliminated branch has been added respectively to the non-central branch leading to the same sample. Thus, for example, $t_{2i-1} = b_1.x_{2i-1} + 2.a_1.x_{2i}$.

As a variant, the weights of an eliminated branch can be transferred partly to the central branch and partly to a non-central branch.

The weighting coefficients of the corresponding synthesis filter are modified in the same way.

Figure 20:
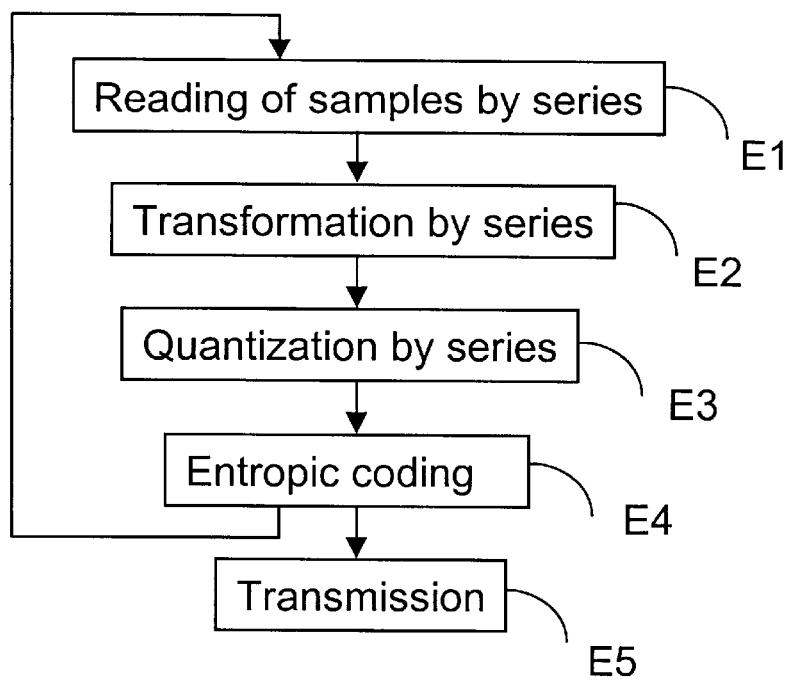
FIG. 20 is a coding algorithm according to the present invention.

FIG. 20 depicts a digital signal coding algorithm according to the present invention.

This algorithm, implemented in the coding device, includes steps E1 to E5.

The coding algorithm can be stored in whole or in part in any information storage means capable of cooperating with the microprocessor. This storage means can be read by a computer or by a microprocessor. This storage means is integrated or not into the device, and can be removable. For example, it can include a magnetic tape, a diskette or a CD-ROM (fixed-memory compact disc).

Step E1 is the reading of a series of samples, for example an input block, of the signal to be coded.

The following step E2 is the transformation of the series of samples read. This transformation is for example an analysis filtering as previously described.

Step E2 is followed by step E3, at which the series of filtered samples is quantized.

The following step E4 is the entropic coding of the previously quantized data.

Steps E1 to E4 are repeated for all the series of samples of the signal to be coded.

Step E4 is followed by step E5, which is the use of the coded data, for example the transmission thereof. It should be noted that the series of coded samples can be transmitted as they are formed, or when all the series of the signal have been coded.

Figure 21:
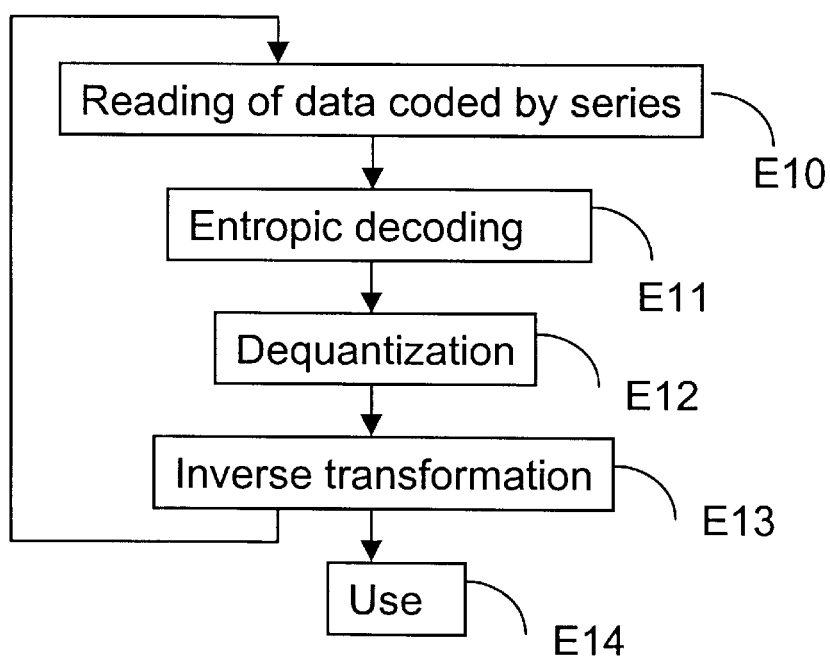
FIG. 21 is a decoding algorithm according to the present invention.
Figure 22B:
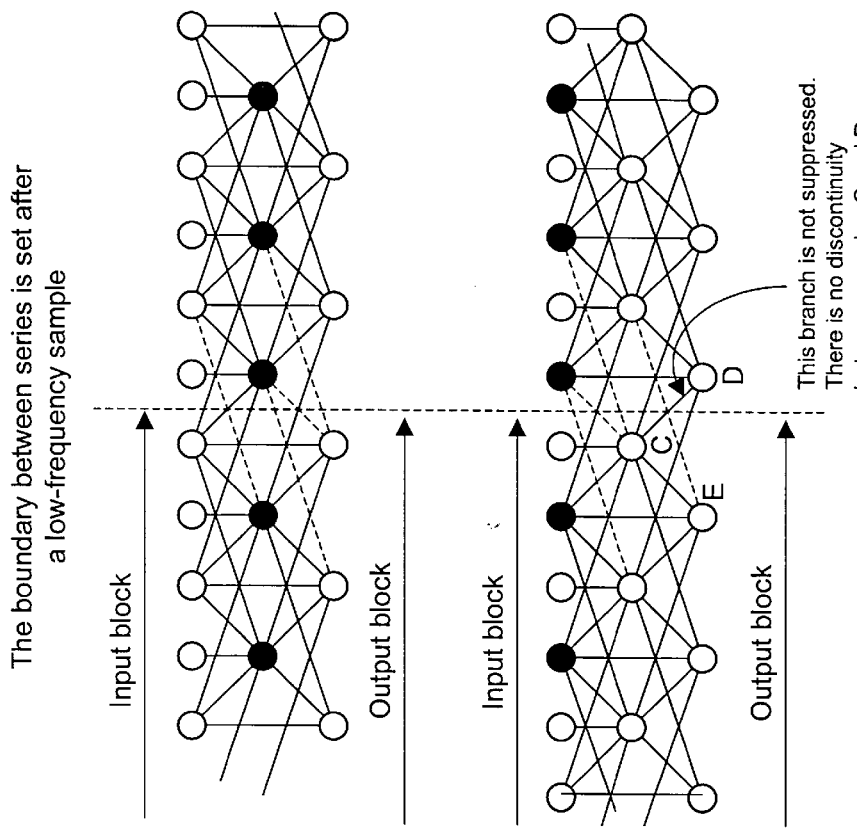
FIGS. 22a and 22b are two trellis representing the effect of the present invention.
Figure 22A:
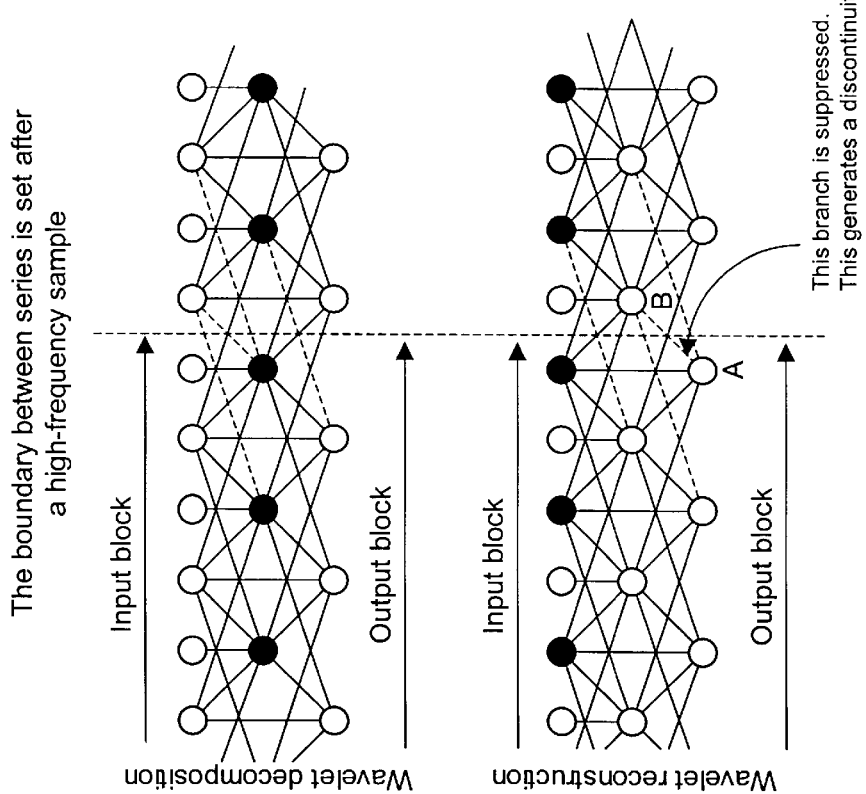

FIG. 21 depicts a digital signal decoding algorithm according to the present invention.

This algorithm, implemented in the decoding device, includes steps E10 to E14.

The decoding algorithm can be stored in whole or in part in any information storage means capable of cooperating with the microprocessor. This storage means can be read by a computer or by a microprocessor. This storage means is integrated or not into the device, and can be removable. For example, it can include a magnetic tape, a diskette or a CD-ROM (fixed-memory compact disc).

Step E10 is the reading of a series of samples to be decoded.

The following step E11 is an entropic decoding of a previously read data.

The following step E12 is a dequantization of the data decoded at the previous step.

The dequantized data then undergo a inverse transformation at step E13, for example a synthesis filtering, as previously described.

Steps E10 to E13 are repeated for all the series of samples to be decoded.

Step E13 is followed by step E14 of using the decoded data, for example displaying them, in the case of an image signal.

Naturally, the present invention is in no way limited to the embodiments described and depicted, but quite the contrary encompasses any variant within the capability of a person skilled in the art.

Notably, the invention is not limited to the field of digital signal coding, but applies to all fields of signal processing, when it is sought to minimise the distortions of a signal which is transformed and then reconstructed.

What is claimed is:

1. A method of analysis filtering of an original digital signal including original samples representing physical quantities, the original samples of the digital signal being transformed by successive calculation steps into high and low frequency output samples, any sample calculated at a given step being calculated by a predetermined function of original samples, and/or previously calculated samples, the samples being ordered in increasing rank, in which:

the signal is processed in successive series of samples, the calculations made on any series not taking into account the samples in a following series, and the any series being determined so that it terminates in an original sample of a same rank as a low-frequency output sample.

2. The method according to claim 1, in which:

the signal is processed by first successive input blocks of samples, the calculations made on a first input block under consideration taking into account only the original or calculated samples belonging to the first input block under consideration, and the first input block under consideration and the first following input block overlap over a predetermined number of original samples.

3. The method according to claim 2, in which:

a start limit of the first input block under consideration is formed between a first original sample and a first output sample, passing successively from a previous sample to a following sample calculated according to the previous sample, the following sample having a rank equal to or greater than the previous sample, an end limit of the first input block under consideration is formed between a second original sample and a second output sample, passing successfully from a previous sample to a following sample calculated according to the previous sample, the following sample having a rank equal to or lower than the previous sample, and the end limit of the first input block under consideration and the start limit of the first following input block are such that there is no compatibility sample having a rank strictly lower than the rank of the sample belonging to the start limit of the first following input block and to the same row as the compatibility sample, and at the same time a rank strictly greater than the rank of the sample belonging to the end limit of the first input block under consideration and to the same row as the compatibility sample.

4. The method according to claim 2 or 3, in which two first successive input blocks overlap over a single original sample.

5. The method according to claim 2 or 3, in which two successive first input blocks overlap over a single original sample having the same rank as a low-frequency output sample.

6. The method according to any one of claim 2 or 3, in which first adjacent output blocks are formed, each first output block corresponding respectively to a first input block, the boundary between two first output blocks being situated between a third and a fourth output sample, the third output sample having a rank lower than that of the fourth output sample, the third and fourth samples being consecutive and chosen so that:

all the samples which have a rank less than or equal to the third output sample are original or calculated samples which are situated in one of the first input blocks, and all the samples which have a rank greater than or equal to the fourth output sample are original or calculated samples which are situated in another one of the first input blocks.

7. The method according to any one of claim 1, 2 or 3, any calculated sample under consideration having the same rank as one of the original samples, and/or previously calculated samples on which it depends, in which the calculation of at least one sample under consideration is modified in order to:

eliminate its dependence on at least one original sample and/or previously calculated sample having a different rank from the sample under consideration, and transfer the eliminated dependence to the original sample or previously calculated sample, having the same rank as the sample under consideration.

8. The method according to claim 7, in which:

the predetermined function is a predetermined linear combination of several original samples, and/or previously calculated samples, weighted by respective weighting coefficients, previously calculated low-frequency samples on which there depend the sample, from which the eliminated dependence originated and the sample to which to the eliminated dependence is transferred are considered, a total weight of the sample from which the eliminated dependence originated is calculated by setting the previously calculated low-frequency samples to the value one and calculating the value of this sample, a total weight of the sample to which the eliminated dependence is transferred is calculated by setting the previously calculated low-frequency samples to the value one and calculating the value of the sample, and the weighting coefficient of the original sample or the previously calculated sample, having the same rank as the sample under consideration, is modified by adding the product of the total weight of the sample from which the eliminated dependence originated and the weighting coefficient of the eliminated dependence, the product also being divided by the total weight of the sample to which the eliminated dependence is transferred.

9. A method of coding a digital signal including original samples representing physical quantities, the coding including:

an analysis filtering effected according to the method according to any one of claim 1, 2, or 3, in order to form filtered samples, a quantization of the previously filtered samples, and an entropic coding of the previously quantized samples.

10. A method of synthesis filtering of a digital signal including high and low-frequency interlaced samples obtained by applying the analysis filtering method according to any one of claim 1, 2, or 3 to an original digital signal including samples representing physical qualities, the samples being ordered by increasing rank, in which:

the signal is processed by successive series of samples, the calculations made on any series not taking into account the samples of a following series, and the any series terminates in a low-frequency sample.

11. The synthesis filtering method according to claim 10, in which:

the signal is processed by second successive input blocks of samples, the calculations performed on a second given input block taking into account only the samples belonging to the given input block, and the second input blocks are formed so that the calculations are adapted to the limits of the second input blocks in correspondence with the calculations made on analysis.

12. The synthesis filtering method according to claim 11, in which adjacent second output blocks are formed, and any second output block includes samples having the same ranks as the samples of a first output block used during the analysis filtering.

13. The method according to any one of claim 1, 2, or 3, in which the original digital signal is an image signal and the original samples are rows of the image.

14. The method according to any one of claim 1, 2, or 3, in which the original digital signal is an image signal and the original samples are columns of the image.

15. A digital apparatus including means of implementing the method according to any one of claim 1, 2, or 3.

16. A storage medium storing a program for implementing a method according to any one of claim 1, 2, or 3.

17. A device for analysis filtering of an original digital signal including original samples representing physical quantities, the device having means of transforming the original samples of the digital signal into high and low frequency output samples by successive calculation steps, any sample calculated at a given step being calculated by means of a predetermined function of original samples, and/or previously calculated samples, the samples being ordered in increasing rank, in which:

the transformation means are adapted to process the signal in successive series of samples, to perform the calculations on any series, not taking into account the samples of the following series, and to terminate the any series in an original sample of a same rank as a low-frequency output sample.

18. The device according to claim 17, in which:

the transformation means are adapted to process the signal by successive first input blocks of samples, the calculations effected on a first input block under consideration taking into account only the original or calculated samples belonging to the first input block under consideration, the first input block considered and the first following input block overlapping over a predetermined number of original samples.

19. The device according to claim 18, in which:

the transformation means are adapted to form a starting limit of the first input block considered between a first original sample and a first output sample, passing successively from a previous sample to a following sample calculated as a function of the previous sample, the following sample having a rank equal to or greater than the previous sample, the transformation means are adapted to form an end limit of the first input block considered between a second original sample and a second output sample, passing successively from a previous sample to a following sample calculated as a function of the previous sample, the following sample having a rank equal to or less than the previous sample, and the transformation means are adapted to form the end limit of the first input block considered and the starting limit of the first following input block so that there exists no compatibility sample having a rank strictly lower than the rank of the sample belonging to the starting limit of the first following input block and to the same row as the compatibility sample, and at the same time a rank strictly greater than the rank of the sample belonging to the end limit of the first input block considered and to the same row as the compatibility sample.

20. The device according to claim 18 or 19, in which the transformation means are adapted to form the first input blocks so that two successive first input blocks overlap on a single original sample.

21. The device according to claim 18 or 19, in which the transformation means are adapted to form the first input blocks so that two successive first input blocks overlap on a single original sample having the same rank as a low-frequency output sample.

22. The device according to claim 18 or 19, in which the transformation means are adapted to form first adjacent output blocks, each first output block corresponding respectively to a first input block, the boundary between two first output blocks being situated between a third and a fourth output sample, the third output sample having a rank below that of the fourth output sample, the third and fourth samples being consecutive and chosen so that:

all the samples which have a rank less than or equal to the third output sample are original or calculated samples which are situated in one of the first input blocks, and all the samples which have a rank greater than or equal to the fourth output sample are original or calculated samples which are situated in another one of the first input blocks.

23. The device according to any one of claims 17 to 19, any calculated sample under consideration having the same rank as one of the original samples, and/or previously calculated samples on which it depends, in which the transformation means are adapted to modify the calculation of at least one sample under consideration in order to:

eliminate a dependence on at least one original sample and/or previously calculated sample having a different rank from the sample under consideration, transfer the eliminated dependence to the original sample or previously calculated sample, having the same rank as the sample under consideration.

24. The device according to claim 23, in which the transformation means are adapted to:

implement a predetermined function which is a predetermined linear combination of several original samples, and/or previously calculated samples weighted by respective weighting coefficients, consider previously calculated low-frequency samples on which there depend the sample from which the eliminated dependence originated and the sample to which the eliminated dependence is transferred, calculate a total weight of the sample from which the eliminated dependence originated by setting the previously calculated low-frequency samples to the value one and calculating the value of this sample, calculate a total weight of the sample to which the eliminated dependence is transferred by setting the previously calculated low-frequency samples to the value one and calculating the value of this sample, modify the weighting coefficient of the original sample or the previously calculated sample, having the same rank as the sample under consideration, by adding a product of the total weight of the sample from which the eliminated dependence originated and the weighted coefficient of this eliminated dependence, the product also being divided by the total weight of the sample to which the eliminated dependence is transferred.

25. A digital signal coding device including original samples representing physical quantities, the coding device having:

analysis filtering means in accordance with the device according to any one of claims 17 to 19, for forming filtered samples, means of quantizing the previously filtered samples, and means for the entropic coding of the previously quantized samples.

26. A device for the synthesis filtering of a digital signal including high and low frequency interlaced samples obtained by analysis filtering of an original digital signal, including samples representing physical quantities, by the filtering device according to any one of claims 17 to 19, the samples being ordered in increasing rank, comprising:

means of transforming the signal which are adapted to process the signal by successive series of samples, to perform the calculation on any series not taking into account the samples of a following series, and to terminate said any series with a low-frequency sample.

27. The device according to claim 26, in which the transformation means are adapted to process the signal by second successive input blocks of samples, the calculations effected on a given second input block taking into account only the samples belonging to the given input block, and in which the transformation means are adapted to form the second input blocks so that the calculations are adapted to the limits of the second input blocks in correspondence with the calculations effected on analysis.

28. The device according to claim 27, in which the transformation means are adapted to form second adjacent output blocks, and any second output block includes samples having the same ranks as the samples of a first output block used during the analysis filtering.

29. A device for the decoding of a digital signal coded by the device of claim 18, comprising:
   means for entropic decoding coded samples of the coded digital signal,
   means for dequantizing the previously decoded samples, and
   means for synthesis filtering the previously dequantized samples, in accordance with the device according to claim 26.

30. The device according to any one of claims 17 to 19, adapted to process an original digital signal which is an image signal and the original samples are rows of the image.

31. The device according to any one of claims 17 to 19, adapted to process an original digital signal which is an image signal, wherein the original samples are columns of the image.

32. The device according to any one of claims 17 to 19, in which the transformation means are incorporated in:
   a microprocessor,
   a read only memory containing a program for filtering the signal, and
   a random access memory containing registers adapted to record the variables modified during the running of said program.

33. The device according to claim 26, in which the transformation means are incorporated in:
   a microprocessor),
   a read only memory containing a program for filtering the signal, and
   a random access memory containing registers adapted to record the variables modified during the running of said program.

34. The device according to claim 25, in which the analysis filtering means are incorporated in:
   a microprocessor,
   a read only memory containing a program for filtering the signal, and
   a random access memory containing registers adapted to record the variables modified during the running of said program.

35. The device according to claim 26, in which the synthesis filtering means are incorporated in:
   a microprocessor,
   a read only memory containing a program for filtering the signal, and
   a random access memory containing registers adapted to record the variables modified during the running of said program.

36. A digital apparatus including the device according to any one of claims 17 to 19.

37. An analysis filtering method of an original digital signal including original samples representing physical quantities, comprising the steps of:
   dividing the original signal in order to form plural series of samples, and
   filtering the original samples in a predetermined order and series by series, in order to generate at least one series of high and low-frequency samples,
   wherein said dividing is performed in such a manner that the end of the at least one series of high and low-frequency samples is a low-frequency sample.

38. The method according to claim 37, wherein each series of samples is a block of samples having samples arranged in two dimensions, said filtering step being performed on each block, and adjacent blocks overlap over a predetermined number of original samples.

39. A computer program product comprising instructions implementing the method according to claim 37, when embodied in a storage device.

40. A computer program product comprising instructions implementing the method according to claim 37, when embodied as a signal conveying instructions.

41. A method of synthesis filtering of a digital signal including high and low-frequency interlaced samples into output samples representing a physical quantity, wherein:
   the signal is processed in successive series of samples in a predetermined order, and the end of the series is a low-frequency sample.

42. The method according to claim 41 wherein:
   the filtering is performed by successive input blocks of samples, a block of sample having samples arranged into two dimensions, and adjacent blocks overlap over a predetermined number of samples.

43. A computer program product comprising instructions implementing the method according to claim 41, when embodied in a storage device.

44. A computer program product comprising instructions implementing the method according to claim 41 when embodied as a signal conveying instructions.

45. A method of synthesis filtering of a digital signal including high and low-frequency interlaced samples into output samples representing a physical quantity, wherein:
   the signal is processed in successive blocks of samples arranged in two dimensions and in a predetermined order in one of the dimensions, the end of the blocks is a low-frequency sample in the one of the dimensions, and adjacent blocks overlap over a single sample.

* * * * *

UNITED STATES PATENT AND TRADEMARK OFFICE
CERTIFICATE OF CORRECTION

PATENT NO. : 6,801,666 B1
APPLICATION NO. : 09/512034
DATED : October 5, 2004
INVENTOR(S) : Felix Henry et al.

It is certified that error appears in the above-identified patent and that said Letters Patent is hereby corrected as shown below:

COLUMN 11:

Line 8, "$x_{21-1}$," should read --$x_{2i-1}$,--.

COLUMN 12:

Line 36, "sample $x_{2i+1}$" should read --sample $x_{2i}$--.
Line 40, "$x_{2i+1}$," should read --$x_{2i-1}$, $x_{2i+1}$,--.

COLUMN 16:

Line 10, "sample $v_2i_4$" should read --sample $v_{2i-4}$--; and
Line 17, "$t_{2i}=v_2-0.25.(v_{2i-2}+v_{2i+2})$." should read --$t_{2i}=v_{2i}-0.25.(v_{2i-2}+v_{2i+2})$.--.

COLUMN 17:

Line 41, "$H_1$=[31  1 2 -1]/2" should read --$H_1$=[-1 2 -1]/2--.

COLUMN 21:

Line 23, "sample $t_2i$" should read --sample $t_{2i}$--.

COLUMN 24:

Line 26, "sample $y^1{}_2i$" should read --sample $y^1{}_{2i}$--.

UNITED STATES PATENT AND TRADEMARK OFFICE
CERTIFICATE OF CORRECTION

PATENT NO. : 6,801,666 B1
APPLICATION NO. : 09/512034
DATED : October 5, 2004
INVENTOR(S) : Felix Henry et al.

It is certified that error appears in the above-identified patent and that said Letters Patent is hereby corrected as shown below:

COLUMN 25:

Line 11, "$z_4 = y^1{}_2 i+{}_2$" should read --$z_4 y^1{}_{2i+2}$--.

Signed and Sealed this

Fifteenth Day of July, 2008

JON W. DUDAS
*Director of the United States Patent and Trademark Office*